(12) United States Patent
Whetsel

(10) Patent No.: US 6,954,080 B2
(45) Date of Patent: *Oct. 11, 2005

(54) METHOD AND APPARATUS FOR DIE TESTING ON WAFER

(75) Inventor: Lee D. Whetsel, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/832,919

(22) Filed: Apr. 26, 2004

(65) Prior Publication Data

US 2004/0201397 A1 Oct. 14, 2004

Related U.S. Application Data

(62) Division of application No. 09/835,802, filed on Apr. 16, 2001, now Pat. No. 6,727,722, which is a division of application No. 09/325,487, filed on Jun. 3, 1999, now Pat. No. 6,262,587, which is a division of application No. 08/742,189, filed on Oct. 31, 1996, now Pat. No. 5,969,538.

(51) Int. Cl.$^7$ .............................................. G01R 31/02
(52) U.S. Cl. ....................................................... 324/763
(58) Field of Search .................................. 324/765, 763

(56) References Cited

U.S. PATENT DOCUMENTS 5,969,538 A * 10/1999 Whetsel ...................... 324/763

* cited by examiner

*Primary Examiner*—Evan Pert
(74) *Attorney, Agent, or Firm*—Lawrence J. Bassuk; W. James Brady; Frederick J. Telecky, Jr.

(57) ABSTRACT

Integrated circuit die on wafer are tested individually, without probing any of the die, using circuitry (TC1–8, BC1–8, LR1–8, RR1–8, PA1–PA4) provided on the wafer.

2 Claims, 30 Drawing Sheets

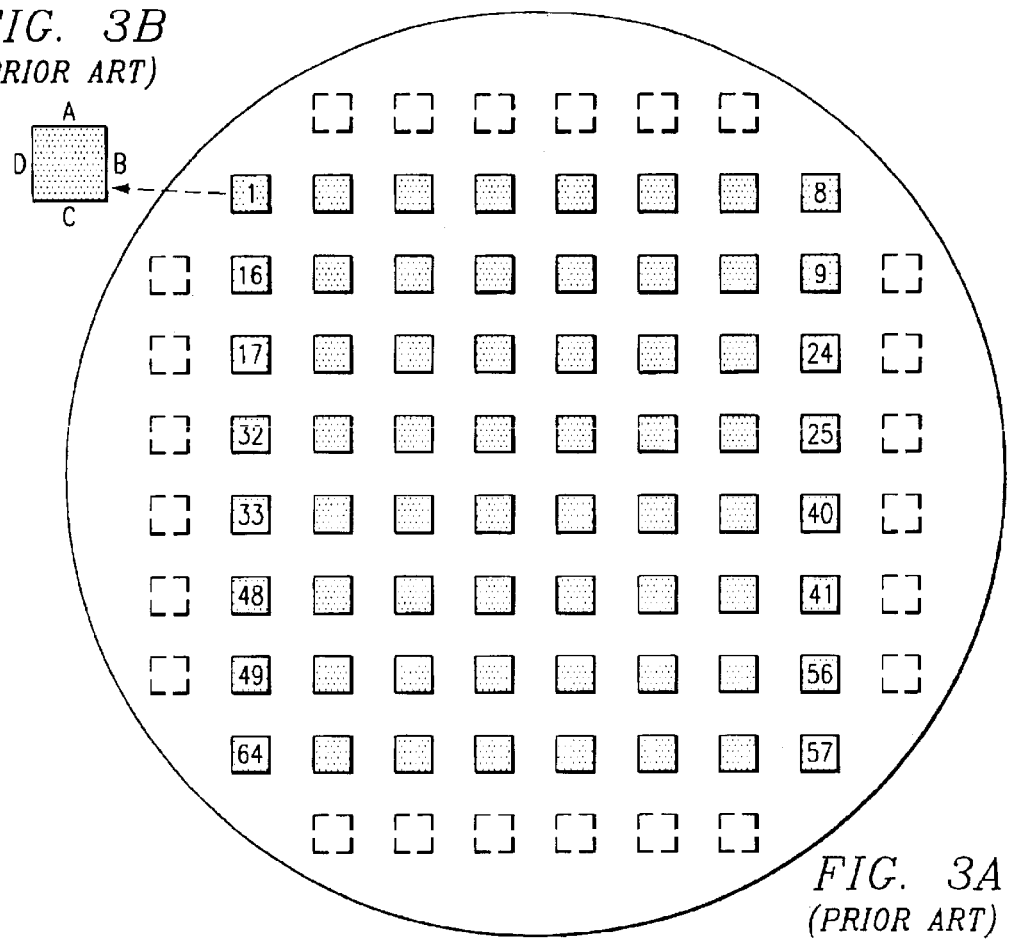
FIG. 3B
(PRIOR ART)
FIG. 3A
(PRIOR ART)
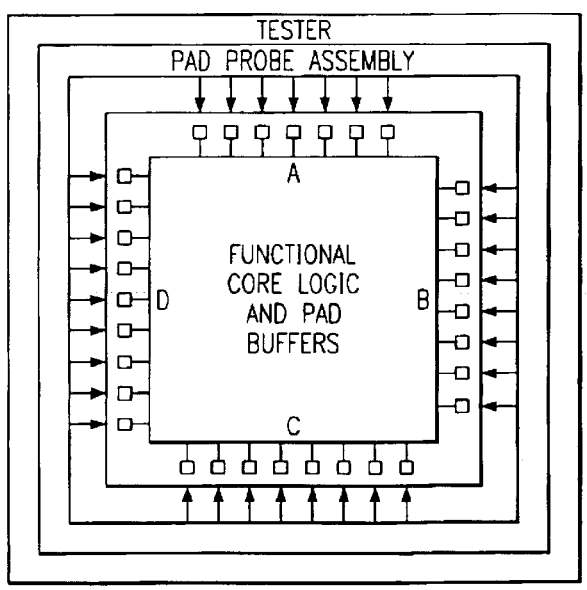
FIG. 4
(PRIOR ART)

FIG. 6
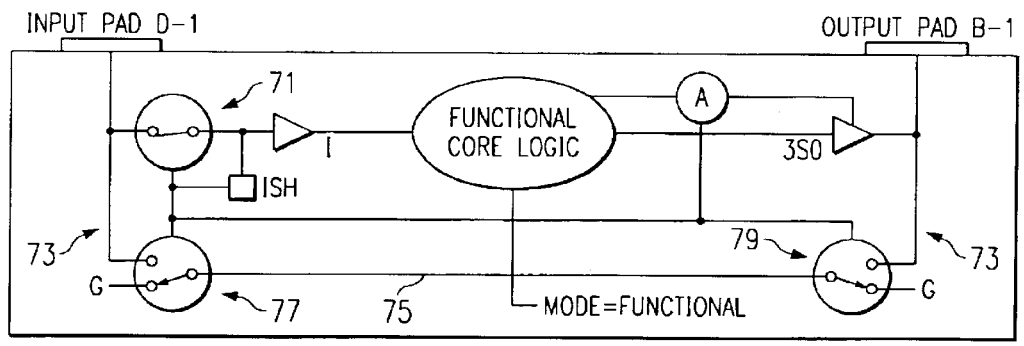
FIG. 7A
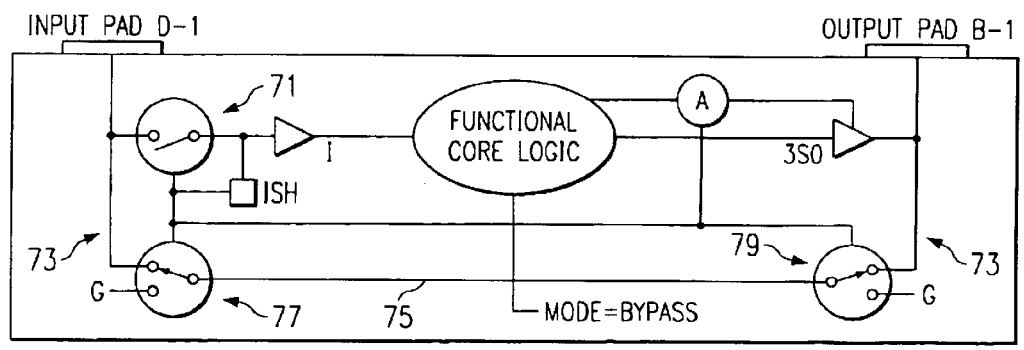
FIG. 7B

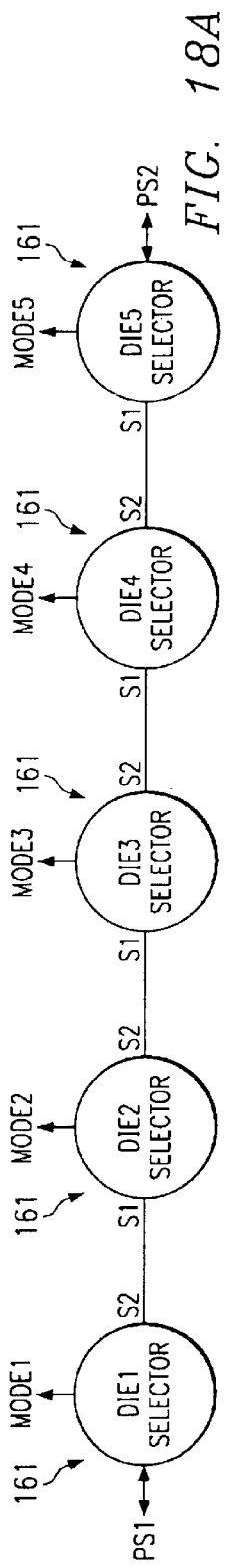
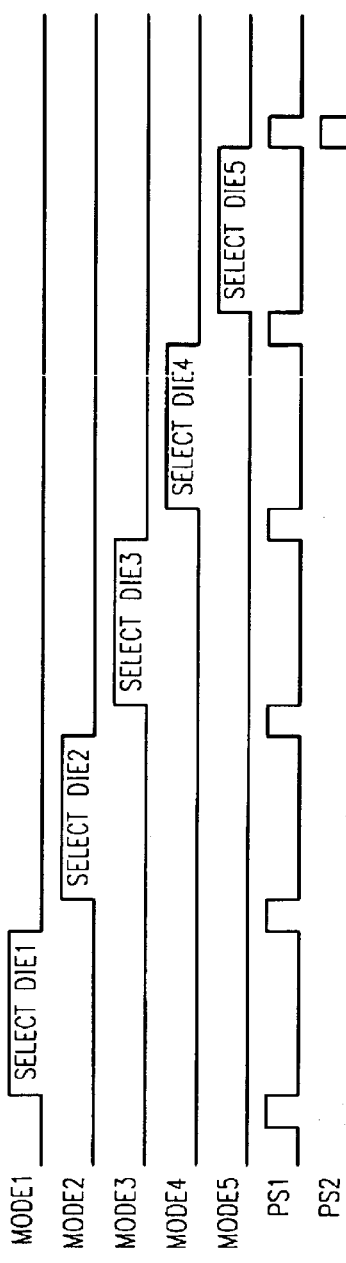
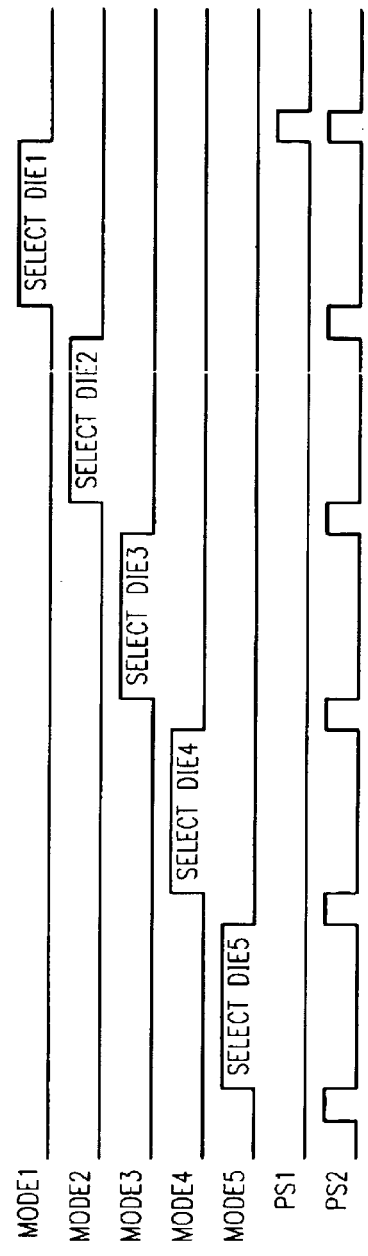
FIG. 18A
FIG. 18B
FIG. 18C

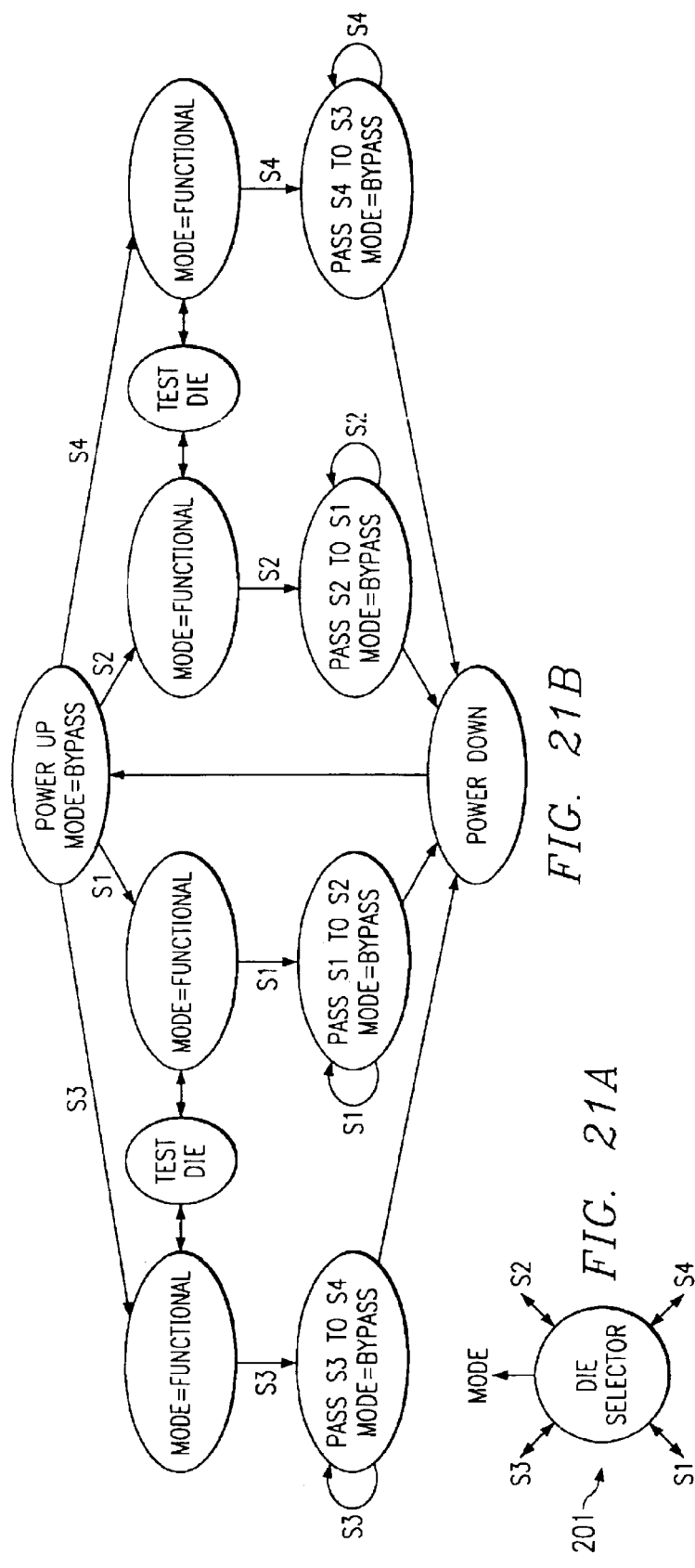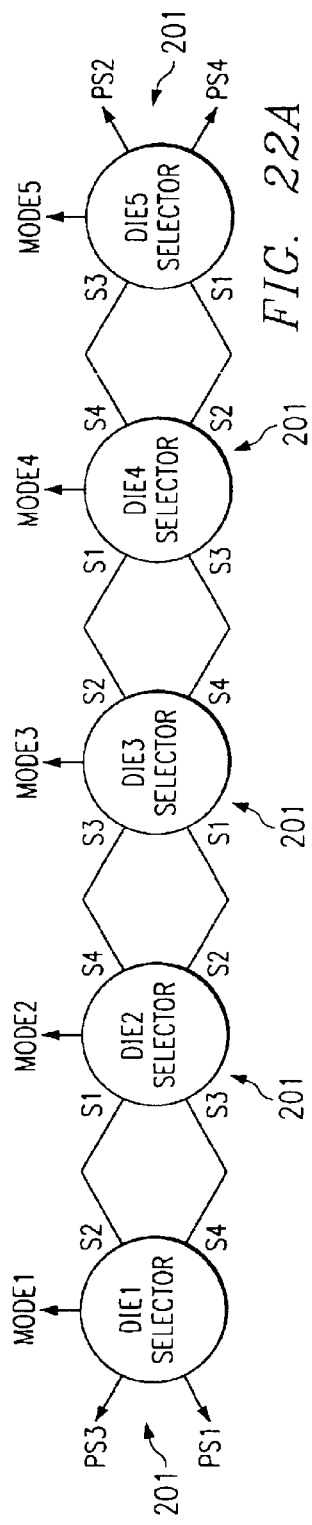
FIG. 21A
FIG. 21B
FIG. 22A

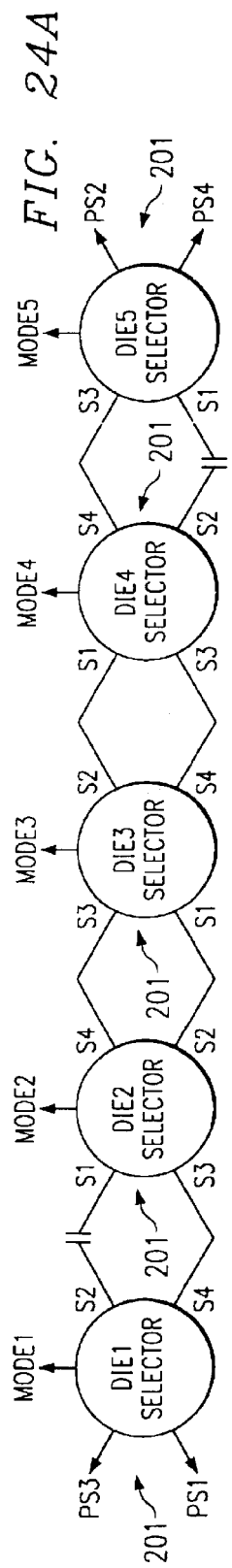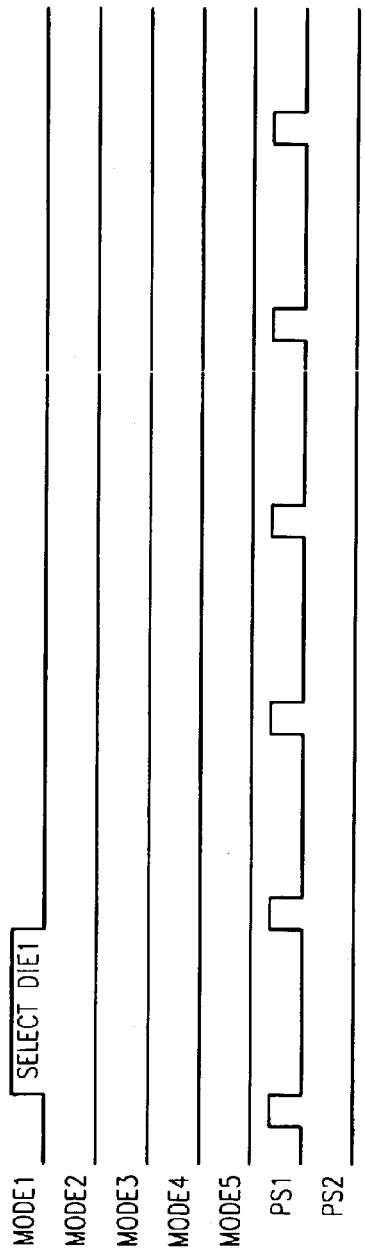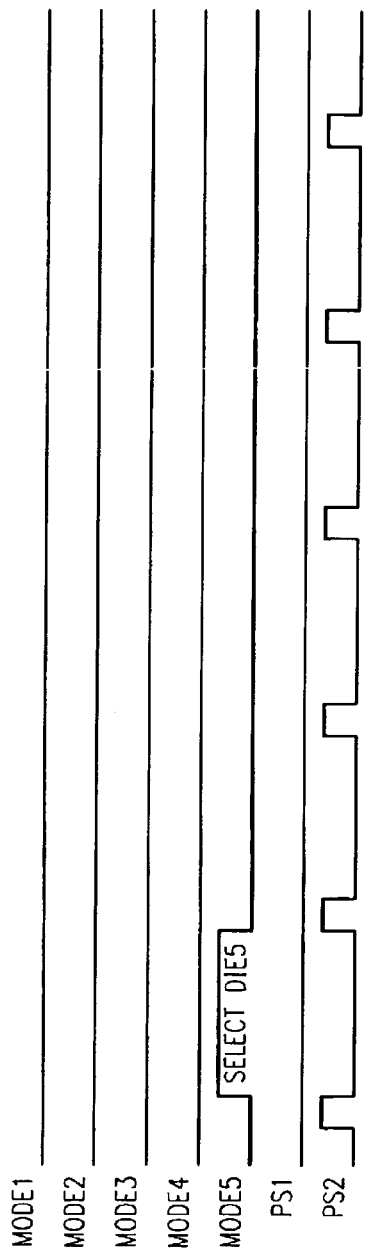

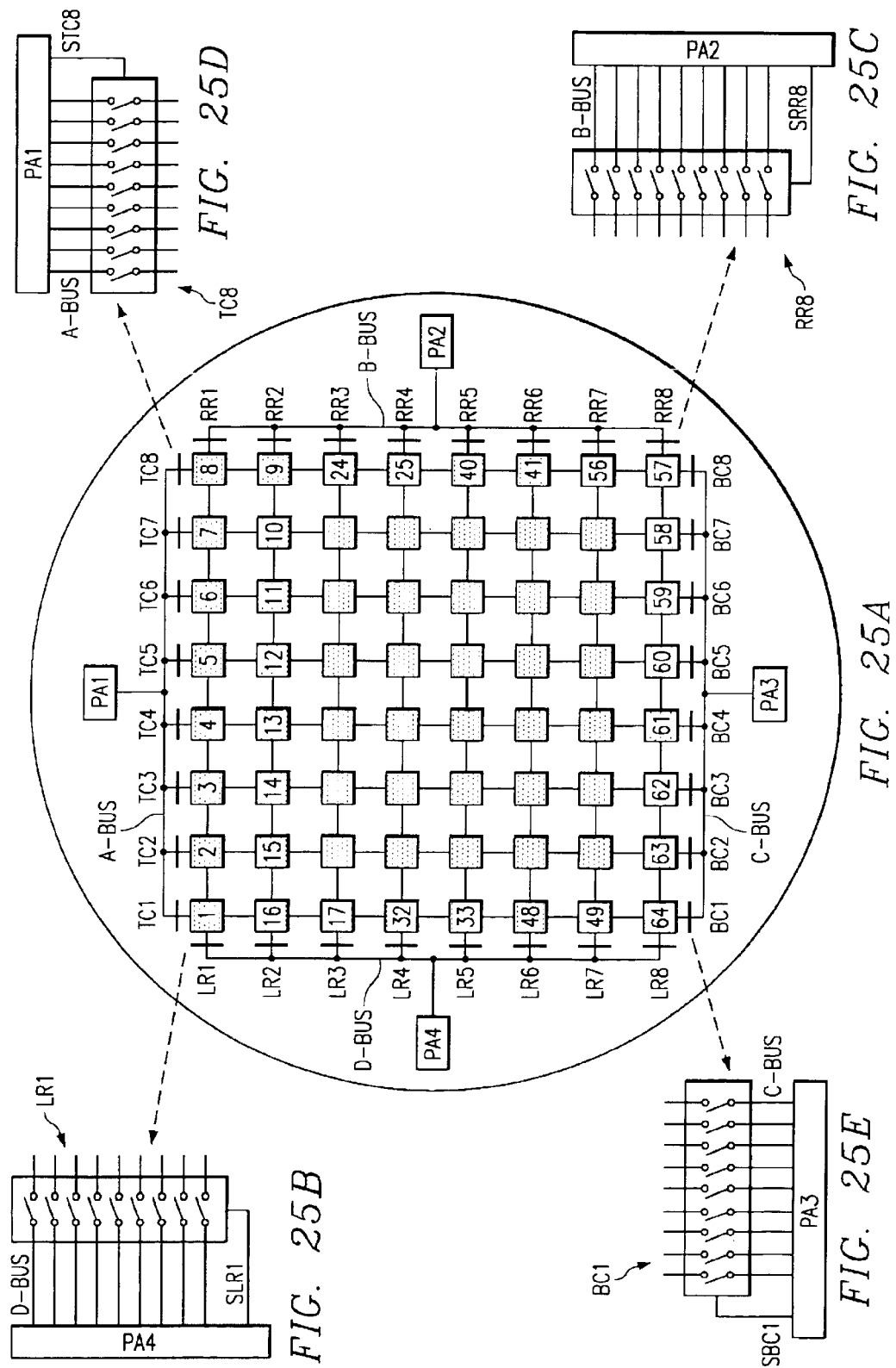

METHOD AND APPARATUS FOR DIE TESTING ON WAFER

This application is a divisional of prior application Ser. No. 09/835,802, filed Apr. 16, 2001, to be U.S. Pat. No. 6,727,722, to be issued Apr. 27, 2004; which was a divisional of prior application Ser. No. 09/325,487, filed Jun. 3, 1999, now U.S. Pat. No. 6,262,587, issued Jul. 17, 2001; which was a divisional of prior application Ser. No. 08/742,189, filed Oct. 31, 1996, now U.S. Pat. No. 5,969,538, issued Oct. 19, 1999.

FIELD OF THE INVENTION

The invention relates generally to integrated circuit manufacturing and, more particularly, to testing die on wafer.

BACKGROUND OF THE INVENTION

Integrated circuit (ICs) manufacturers produce die on typically circular substrates referred to as wafers. A wafer may contain hundreds of individual rectangular or square die. Die on wafer, or unsingulated die, must be tested to determine good from bad before the dies are singulated. Unsingulated die testing traditionally occurs by physically probing each die at the die pads, which allows a tester connected to the probe to determine good or bad die. This type of probing is relatively slow and requires expensive mechanical mechanisms to accurately step and position the probe at each die location on the wafer. The probing step can damage the die pads which may interfere with the bonding process during IC packaging or assembly of bare die on MCM substrates. Also, as die sizes shrink, pads are positioned closer and closer together and it becomes more difficult and costly to design precision probing instruments to access them.

Alternate conventional methods for testing unsingulated die on wafers include: (1) designing each die to test itself using built-in-self-test (BIST) circuitry on each die and providing a way to enable each die BIST circuitry to test the die, (2) widening the scribe lanes between the die to allow for: (a) test probe points, (b) test access conductors, and/or (c) test circuitry, and (3) processing an overlying layer of semiconductor material with test circuitry over the die on wafers and providing via connections, from the overlying layer, to the pads of each die on the wafer. Method 1 disadvantageously requires BIST circuitry on the die which takes up area, and the BIST circuitry may not be able to adequately test the I/O of the die. Method 2 disadvantageously reduces the number of die that can be produced on a wafer since the widening of the scribe lanes takes up wafer area which could be used for additional die. Method 3 disadvantageously requires additional wafer processing steps to form the overlying test connectivity layer on top of the die on wafers, and also the overlying layer needs to be removed from the wafer after testing is complete. This overlying layer removal step is additive in the process and the underlying die could be damaged during the removal step.

Ideally, only good die are singulated and packaged into ICs. The cost of packaging die is expensive and therefore the packaging of bad die into ICs increases the manufacturing cost of the IC vendor and results in a higher cost to the consumer.

FIG. 1 illustrates a schematic of a die containing functional core logic (FCL) and input and output buffering to pad locations. The variety of pad buffering shown includes: inputs (I), 2-state outputs (2SO), 3-state outputs (3SO), open drain outputs (ODO), input and 3SO bidirectionals (I/O1), and input and ODO bidirectionals (I/O2). The FCL could be a custom or semicustom (ASIC) implementation comprising: microprocessors, combinational logic, sequential logic, analog, mixed signal, programmable logic, RAMs, ROMs, Caches, Arrays, DSPs, or combinations of these and/or other functions. The die is shown having a top side A, right side B, bottom side C, and left side D for convenience of description in regard to its position on the wafer. The die also has at least one voltage supply (V) pad and at least one ground (G) pad for supplying power to the die. Side A has pad locations 1–7, B has pad locations 1–8, C has pad locations 1–8, and D has pad locations 1–9. The arrangement of the buffer/pad combinations on each side (A, B, C, D) corresponds to the desired pinout of the package that the die will be assembled into, or to signal terminals on a multi-chip module (MCM) substrate onto which the die will be connected. FIG. 2 is a cutaway side view of the die showing an input pad at D2 and an output pad at B2 both connected to the FCL.

FIG. 3A shows an example wafer containing 64 of the die of FIG. 1. FIG. 3B shows the position of each die on the wafer with respect to sides A, D, C, and D. The phantom die in dotted line shows how the wafer would be packed to yield more die per wafer. Notice that even when the die is tightly packed on the wafer (i.e. the phantom die locations utilized), there is still area at the periphery of the wafer where die cannot be placed. This is due to the circular shape of the wafer versus the square/rectangular shape of the die. This unusable peripheral area of the wafer can be used to place test points (pads), test circuitry, and conductors for routing test signals and power and ground to die.

FIG. 4 shows how conventional die testing is performed using a tester and pad probe assembly. The probe assembly is positioned over a selected die and lowered to make contact with the die pads. Once contact is made the tester applies power and checks for high current. If current is high a short exists on the die and test is aborted and the die is marked (usually by an ink color) as bad. If current is normal, then testing proceeds by applying test patterns to the die and receiving test response from the die. If the test fails the die is marked as bad. If the test passes the die is good and not marked, or if marked, marked with a different ink color. During testing the die current can be monitored to see if it stays within a specified range during the test. An out of range current may be marked as a high current functional failure.

Such conventional wafer testing has several disadvantages. The act of probing the die scars the metal die pads. Thus, using physical probing, it is essential that dies be tested only once, since re-probing a die to repeat a test may further damage the pads. Even a single probing of a die may cause enough pad damage to adversely affect subsequent assembly of the die in IC packages or on MCM substrates. With the extremely small target provided by a die pad, the equipment used for positioning the probe on a die pad must be designed with great care and is therefore very expensive to purchase/build and maintain and calibrate. Also the stepping of the probe to each die location on the wafer takes time due to the three dimensional motions the probe must be moved through to access and test each die on the wafer.

It is therefore desirable to test die on wafers without the disadvantages described above.

The present invention provides: a die framework comprising die resident circuitry and connections to selectively provide either a bypass mode wherein the die has direct pad-to-pad connectivity or a functional mode wherein the die has die pad to functional core logic connectivity; a fault tolerant circuit and method to select a die on a wafer to be placed in functional mode while other die remain in bypass mode; a method and apparatus for (1) electronically selecting one die on a wafer to be placed in functional mode for testing while other die on the wafer are in bypass mode, (2) testing that selected die, and (3) repeating the electronic selection and testing steps on other die; and a method and apparatus for (1) electronically selecting a plurality of diagonally positioned die on the wafer to be placed in functional mode for testing while other die on the wafer are in bypass mode, (2) testing the selected group of diagonally positioned die in parallel, and (3) repeating the electronic selection and testing steps on other groups of diagonally positioned die.

The present invention provides improved testing of unsingulated die on wafer. The invention provides the following exemplary improvements: (1) electronic selection and testing of unsingulated die on wafer, (2) faster testing of dies on wafer, (3) elimination of expensive, finely designed mechanical wafer probes, (4) the ability to at-speed test unsingulated die on wafer. (5) the ability to test a plurality of unsingulated die in parallel, and (6) the ability to simplify the burn-in testing of unsingulated die.

BRIEF DESCRIPTION OF THE DRAWINGS

FIGS. 3A–3B illustrate the placement and orientation of a plurality of die on a conventional wafer.

FIG. 4 illustrates a conventional arrangement for testing die on a wafer.

FIG. 6 schematically illustrates pad-to-pad connections that exist in the die of FIG. 5 when in a bypass mode.

FIGS. 7A–11B are cutaway side views of various portions of the FIG. 5 die in both functional and bypass modes.

FIGS. 18A–18C illustrate the structure and operation of the die selection scheme of FIG. 16A.

FIGS. 21A–21B illustrate the operation of the die selectors of FIG. 20A.

FIGS. 24A–24C illustrate a fault tolerant feature of the die selection scheme of FIG. 20A.

FIGS. 25A–25E illustrate an exemplary arrangement according to the present invention for testing die on wafer.

DETAILED DESCRIPTION

Figure 1:
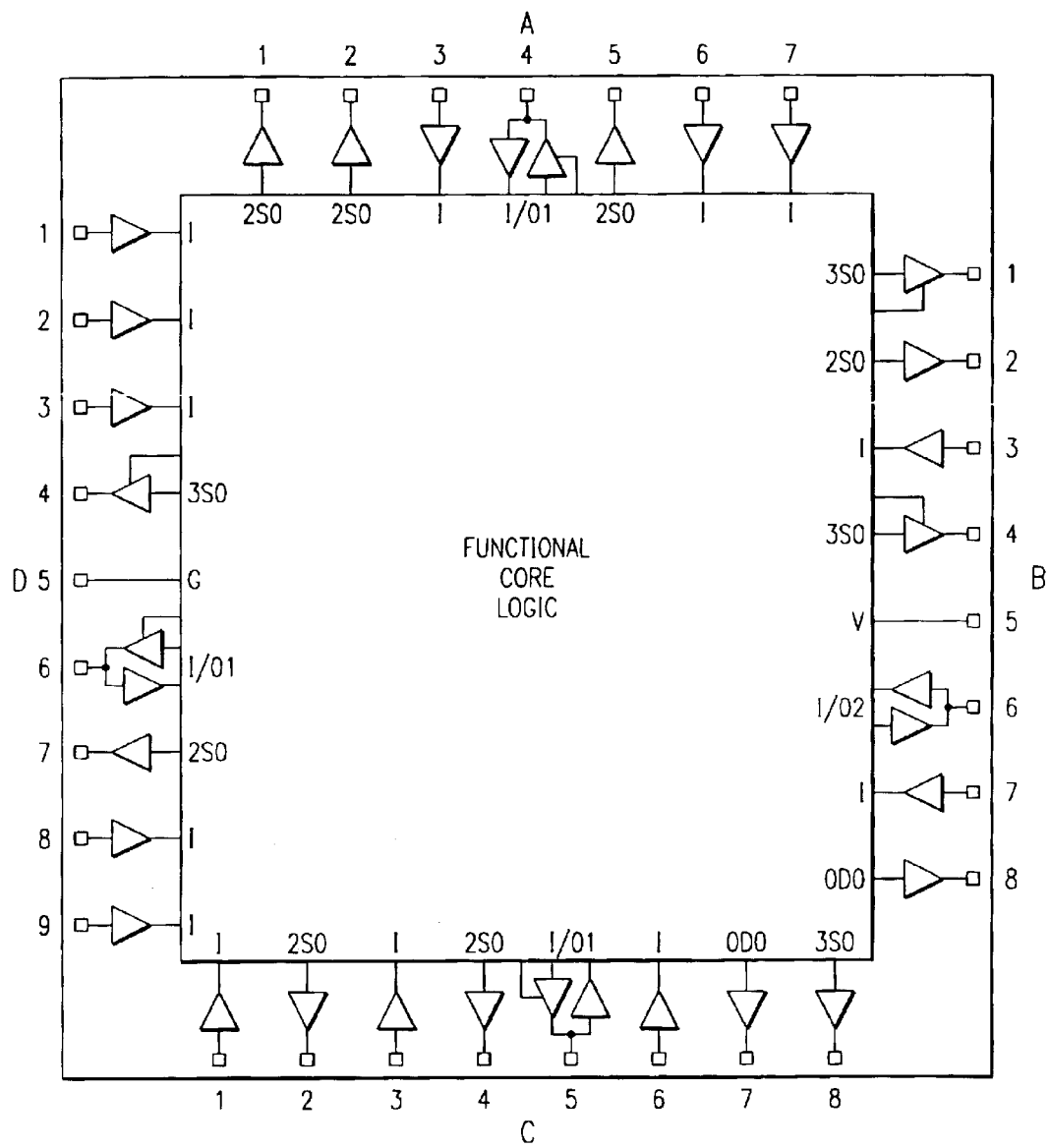
FIG. 1 diagramatically illustrates the functional core logic, input and output pads and pad buffering structures of a conventional integrated circuit die.
Figure 2:
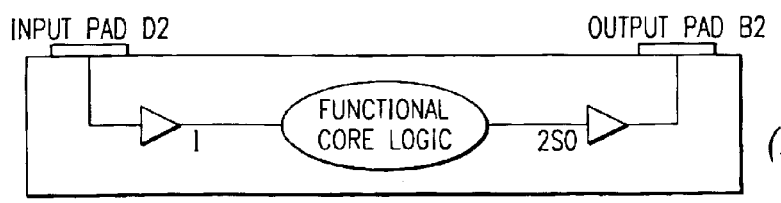
FIG. 2 is a cutaway side view of a portion of the conventional die of FIG. 1.
Figure 5:
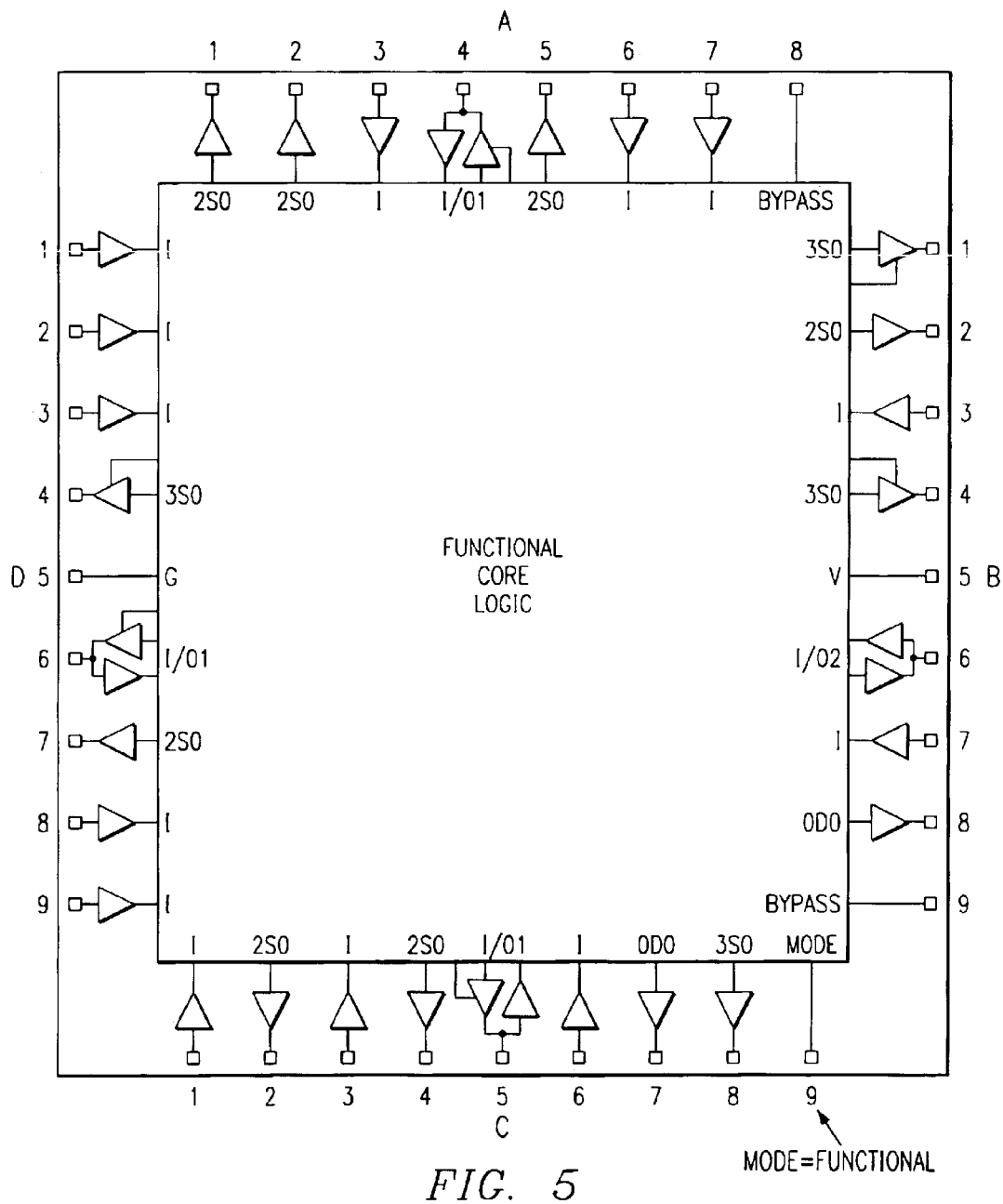
FIG. 5 diagramatically illustrates the functional core logic, input and output pads and pad buffering of an exemplary integrated circuit die according to the present invention.

In FIG. 5 a die schematic similar to that of FIG. 1 is shown. Like FIG. 1, the die has sides A, B, C, and D and corresponding pad sites for input, output, input/output, V and G. FIG. 5 includes additional pad sites A8 and B9 referred to as bypass, and an additional pad site C9 referred to as mode. The mode pad is buffered like a data input. When mode is at a predetermined logic level, say high, the die schematic appears as shown in FIG. 5, and the die is in its functional mode which is exactly the equivalent of the die in FIG. 1. In functional mode, the FCL, input, output, and input/output pads are enabled and the die performs its intended function. In functional mode, the bypass pads are not used.

In exemplary FIG. 6, the die of FIG. 5 is schematically shown as it would operate in the bypass mode of the present invention. The die is placed in bypass mode by taking the mode pad to a logic state opposite that of the functional mode logic state, in this case a logic low. In bypass mode, the die's FCL, input, output, and input/output buffers are disabled and pad sites of corresponding position between sides A and C and between sides D and B are electrically connected. In bypass mode the die is transformed into a simple interconnect structure between sides A and C and between sides D and B. The interconnect structure includes a plurality of conductors extending parallel to one another between sides A and C, and a further plurality of conductors extending parallel to one another between sides D and B. While in bypass mode, signals from a tester apparatus can flow through the interconnects between A and C and between D and B to access and test a selected die on a wafer.

While most bypass connections can be made between existing functionally required pad sites, the number of functional pad sites on one side may not equal the number of functional pad sites on the opposite side. Thus the bypass pads of FIG. 5 provide pad-to-pad connectivity when the number of pads on opposite sides are not equal. For example, in FIGS. 5 and 6, bypass pads A8 and B9 provide connecting pads for functional pads C8 and D9 respectively. The bypass connections between opposite side die pads form a low impedance, bidirectional signaling path through the die from pad to pad. The bypass connections between two sides are preferably designed to have an equal propagation delay between opposite side pads to avoid skewing of test signals passed through bypassed die.

Assuming for example the die positioning shown on the wafer of FIG. 3A, the sides of a die selected for testing need to be driven by signals from the adjacent sides of top, right, bottom, and left neighboring die which are in bypass mode (FIG. 6). In order for the neighboring die to be tested, it is placed in functional mode, and: (1) all signals required at its A side are provided at the C side of the top neighboring bypassed die, (2) all signals required at its B side are provided at the D side of the right neighboring bypassed die, (3) all signals required at its C side are provided at the A side of the bottom neighboring bypassed die, and (4) all signals required at its D side are provided at the B side of the left neighboring bypassed die.

FIGS. 7 through 14 depict cross section views of example circuitry and connections which can achieve the framework for selective die functional and bypass modes.

Exemplary FIGS. 7A and 7B illustrate side views of the D1 input pad and the B1 3-state output pad of the die in FIGS. 5 and 6. A switch 71 is provided between the input pad and input buffer to allow isolating the input pad from the input buffer during bypass mode, and an input state holder (ISH) circuit is provided between the switch and input buffer to allow holding a predetermined input state to the input buffer (which drives the FCL) while the switch is open during bypass mode. Gating circuitry, such as an AND gate (A), is provided in the control path between the FCL and 3-state output buffer to allow the 3-state output buffer to be disabled during bypass mode. A selectable connection path 73 between the input and output pad includes a conductor 75 connected between a switch 77 associated with the input pad and a switch 79 associated with the output pad, which switches are operable to connect conductor 75 to G or to the input and output pads. The mode pad is connected to the switches. ISH and gate A as shown such that when the mode pad is in one logic state the die is in functional mode and when in the opposite logic state the die is in bypass mode. The mode pad can be connected to FCL as shown to permit disabling of clocks or other operations in FCL during bypass mode.

Figure 12A:
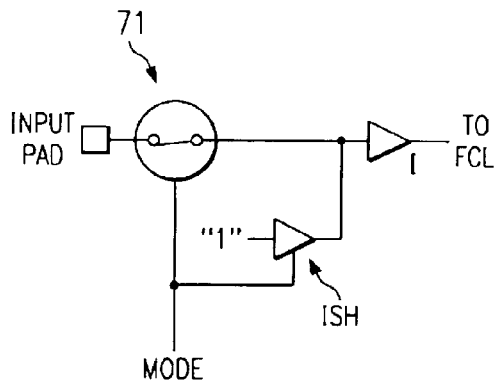
FIG. 12A illustrates an exemplary embodiment of the input state holder of FIG. 7A.
Figure 12B:
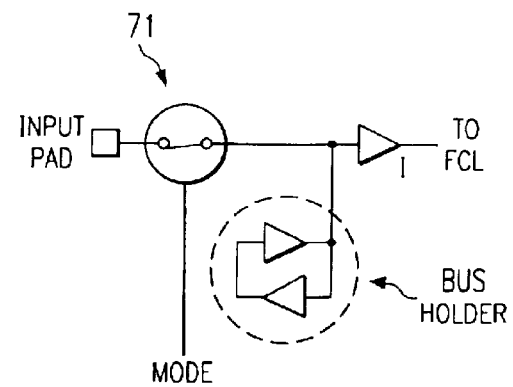
FIG. 12B illustrates an alternative to the input state holder of FIG. 12A.

As shown in exemplary FIG. 12A, ISH can be realized with a 3-state data buffer having a data input connected to a desired logic level (logic "1" in this example) and a data output connected to the input of the input buffer and a 3-state control input connected to the mode pad. The desired logic level for a given FCL input could be, for example, a logic level which minimizes current flow in the FCL during bypass mode. The 3-state buffer is enabled during bypass mode and 3-stated during functional mode. If the desired logic level is a don't care condition, then the bus holder BH of exemplary FIG. 12B can be used to hold the last input logic level during bypass mode.

When in functional mode (FIG. 7A), the switches 77 and 79 connect the conductor 75 to G which provides a ground plane on the conductor and prevents AC coupling between the input and output pads. When in bypass mode (FIG. 7B), the switches 77 and 79 and the conductor 75 provide a low impedance, bidirectional signaling path connection between the input and output pads. In bypass mode, switch 71 is open to isolate FCL from the input pad, and the 3-state output buffer is disabled (3-stated) via AND gate A to isolate FCL from the output pad.

The examples of FIGS. 8–11 show the use of the bypass circuitry with other types of pad buffers. FIGS. 13 and 14 show the use of the bypass circuitry between functional input (D9) and bypass (B9) pads, and functional output (C8) and bypass (A8) pads.

Figure 8A:
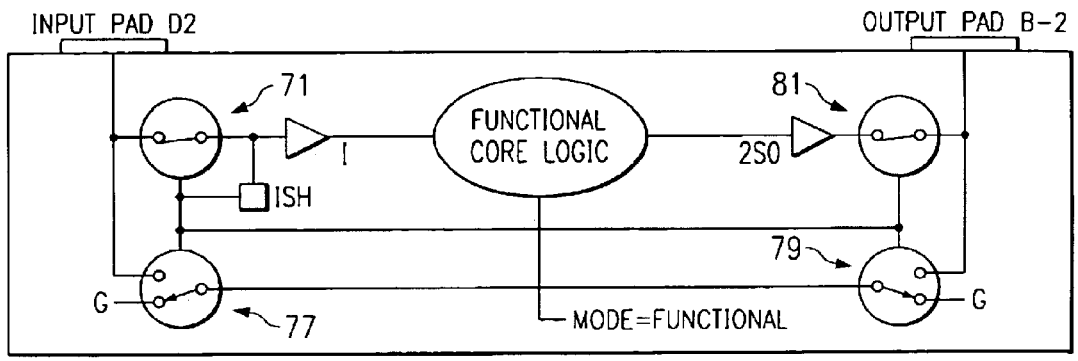
Figure 8B:
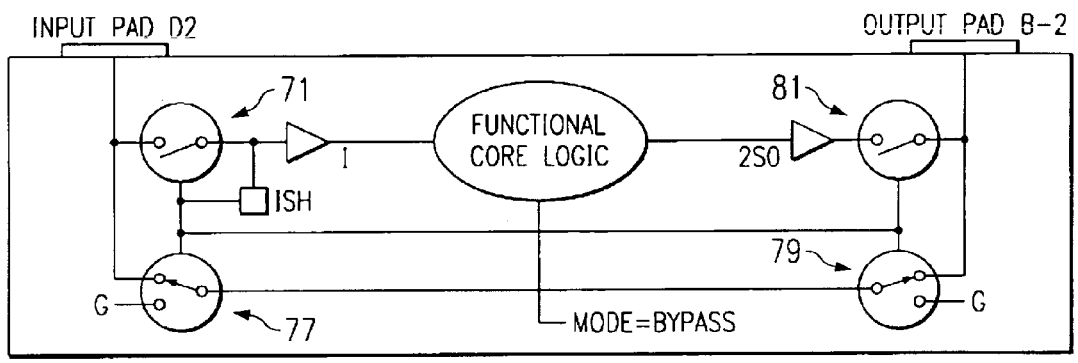
Figure 8C:
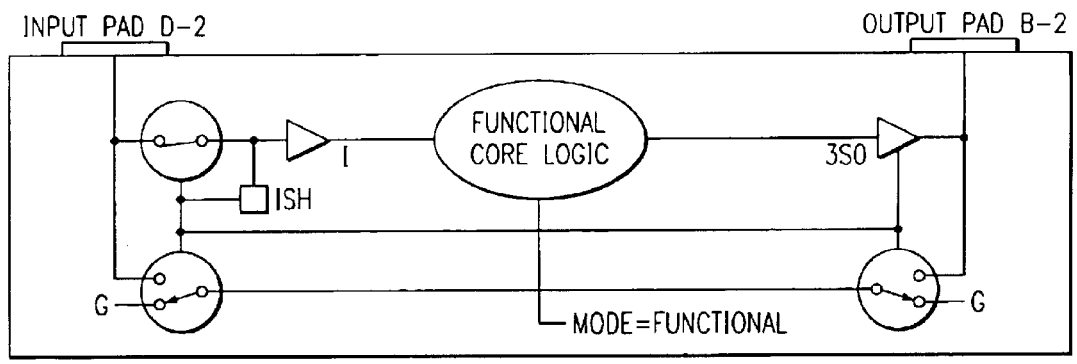
Figure 8D:
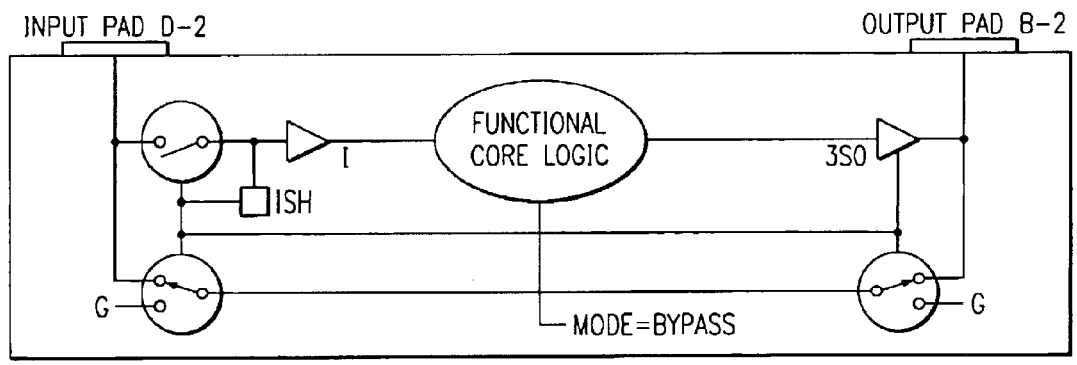

In FIGS. 8A and 8B, a further switch 81 is used to isolate the 2-state output buffer from output pad B2 during bypass mode. FIGS. 8C and 8D are similar to FIGS. 8A and 8B except a 3-state output buffer is used instead of a 2-state output buffer and switch 81, in order to eliminate the impedance of switch 81 during functional mode.

Figure 9A:
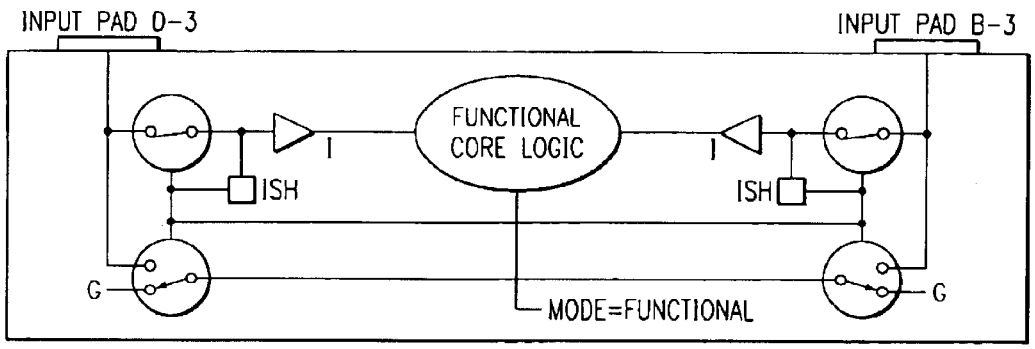
Figure 9B:
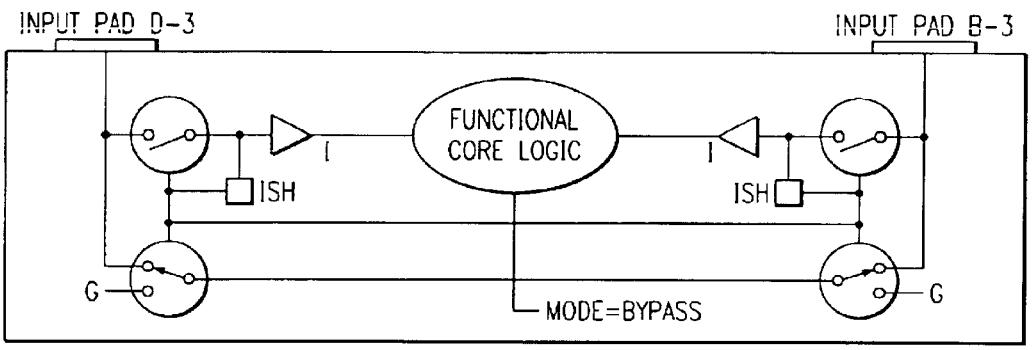
Figure 10A:
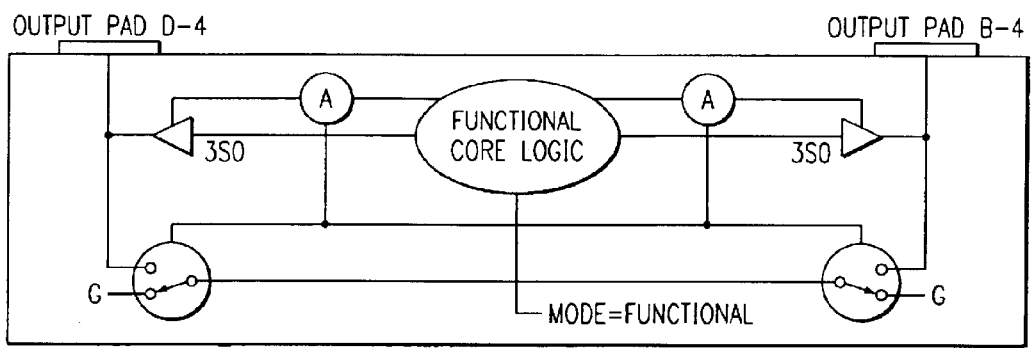
Figure 10B:
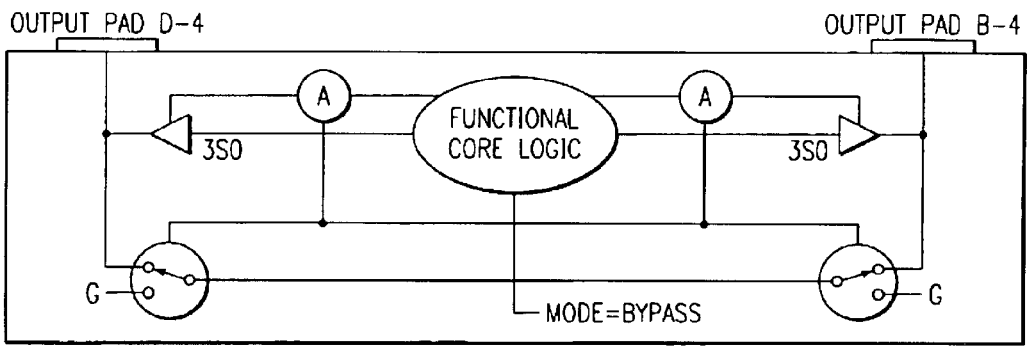

The input pads in FIGS. 9A and 9B and the 3-state output pads in FIGS. 10A and 10B are arranged in the manner described above with respect to FIGS. 7A and 7B.

Figure 11A:
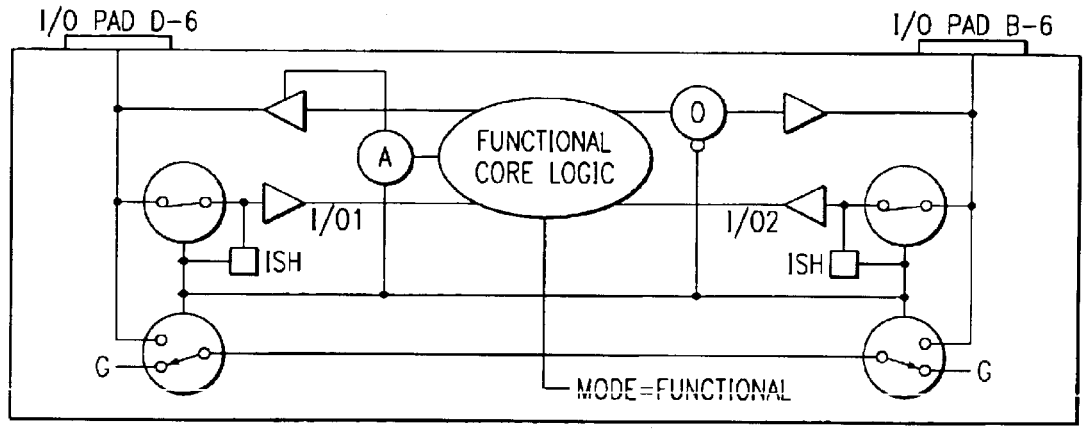
Figure 11B:
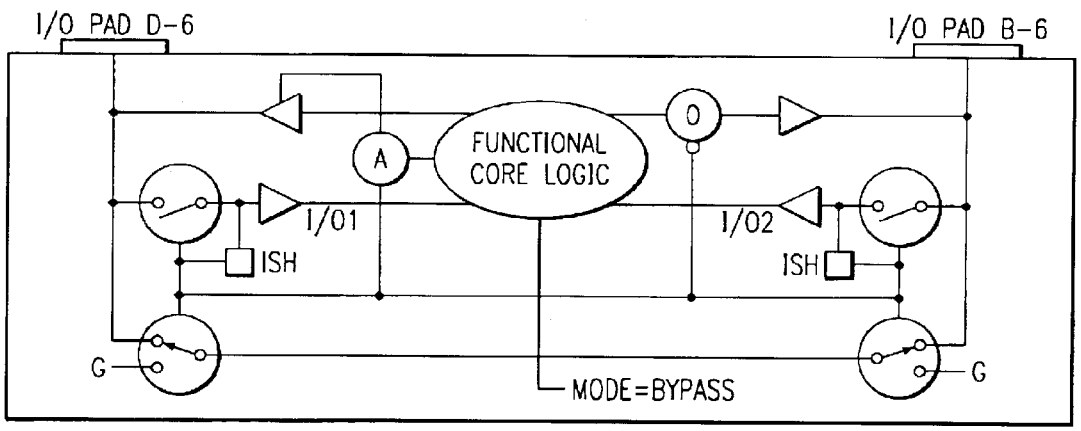

FIGS. 11A and 11B illustrate I/O pads with 3-state (I/O1) and open drain (I/O2) outputs. The input buffers and the 3-state output buffer of FIGS. 11A and 11B are arranged as described above with respect to FIGS. 7A and 7B. The open drain output buffer of FIGS. 11A and 11B has its input connected to an output of an OR gate (O) which has one input driven by FCL and another input driven by the logical inverse of the mode signal, whereby the open drain output will float high during bypass mode assuming that the mode signal selects bypass mode when low.

Figure 13A:
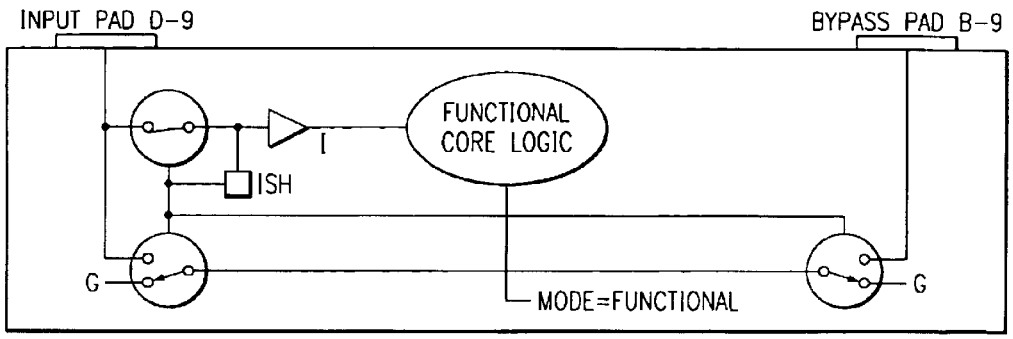
FIGS. 13A–14B are further cutaway side views similar to FIGS. 7A–11B.
Figure 13B:
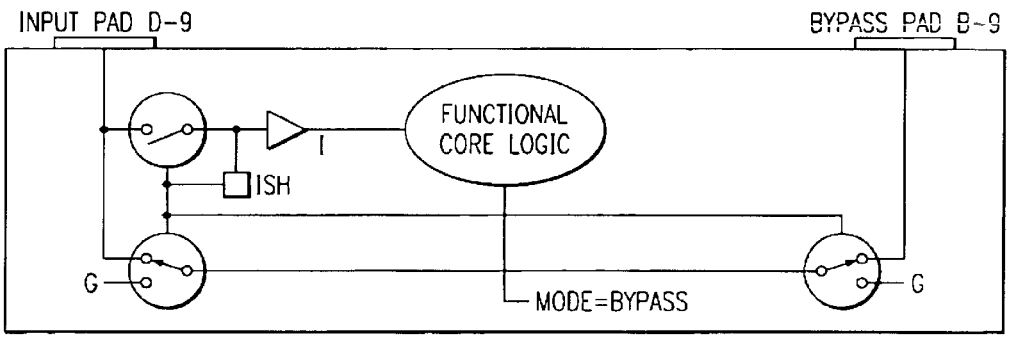
Figure 14A:
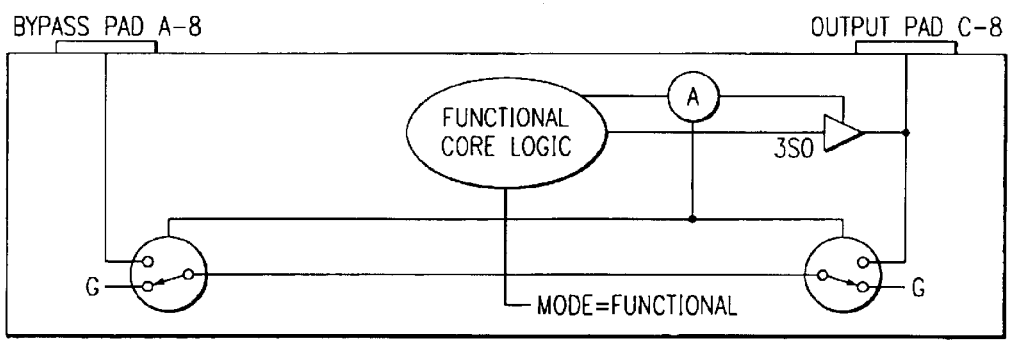
Figure 14B:
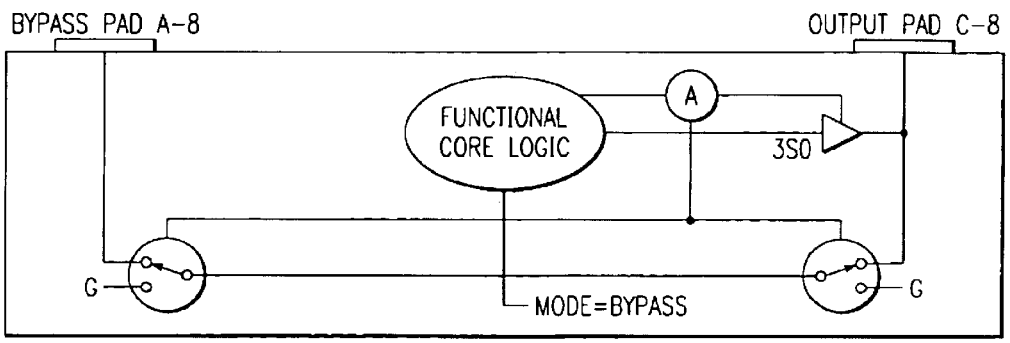

The input pad in FIGS. 13A and 13B, and the 3-state output pad in FIGS. 14A and 14B are arranged in the manner described above with respect to FIGS. 7A and 7B.

Figures 15A, 15B:
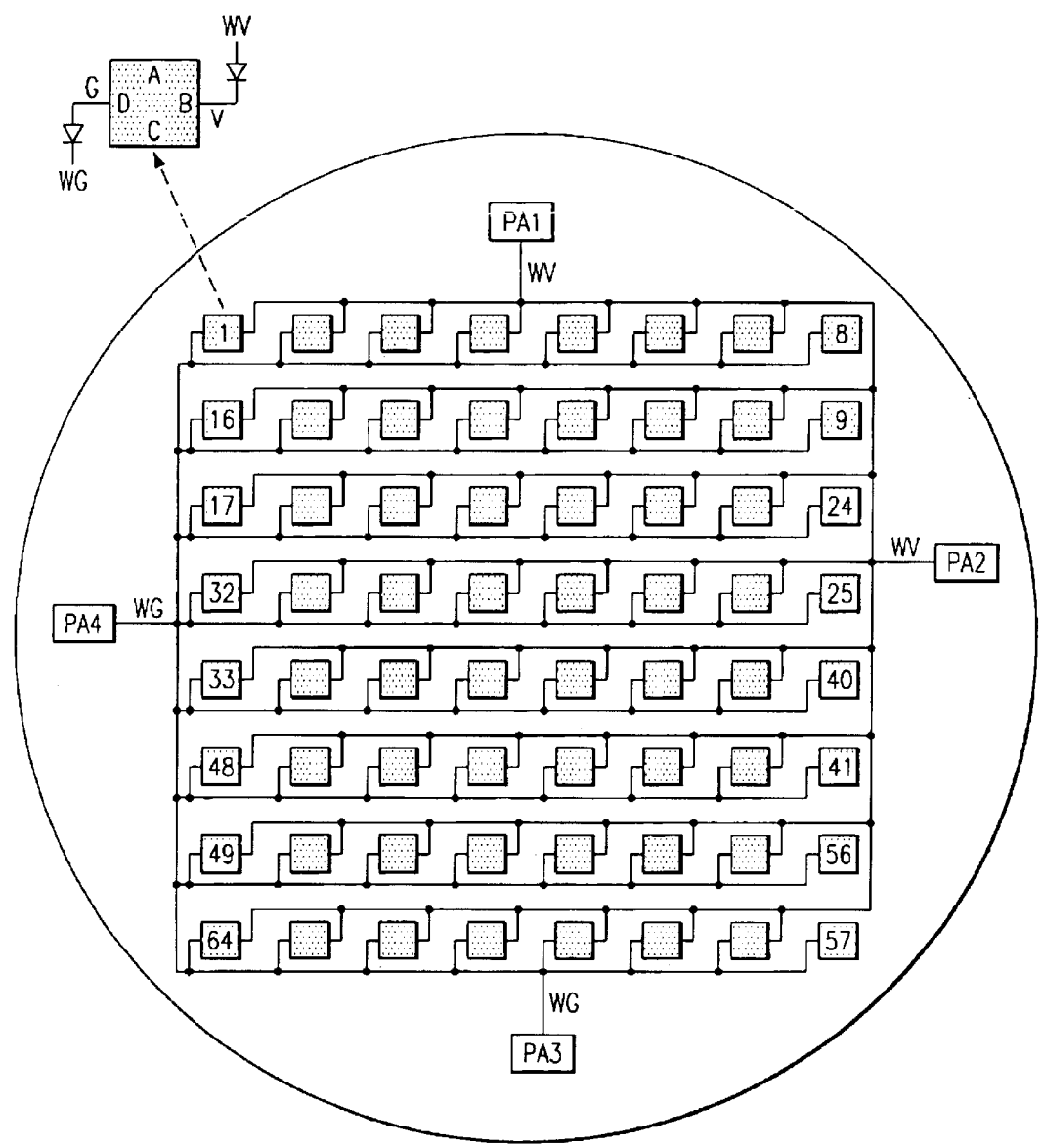
FIGS. 15A–15B illustrate an exemplary arrangement for bussing power and ground to each die on a wafer.

FIG. 15A illustrates an example of how wafer voltage (WV) and wafer ground (WG) bussing can be distributed to the V and G pads of each die on the wafer. The WV bussing is shown originating from areas of the wafer designated as probe area PA1 and probe area PA2. The WG bussing is shown originating from probe area PA3 and probe area PA4.

Probe areas PA1–4 are positioned at the periphery of the wafer and in areas where die cannot be placed, as mentioned in regard to FIG. 3A. FIG. 15B illustrates how WV and WG are coupled to the V and G die pads (see FIGS. 1 and 5) through diodes. By placing diodes between WG and G and WV and V, conventional localized probing and power up of an individual die can occur without powering up neighboring dies.

Figures 16A, 16B:
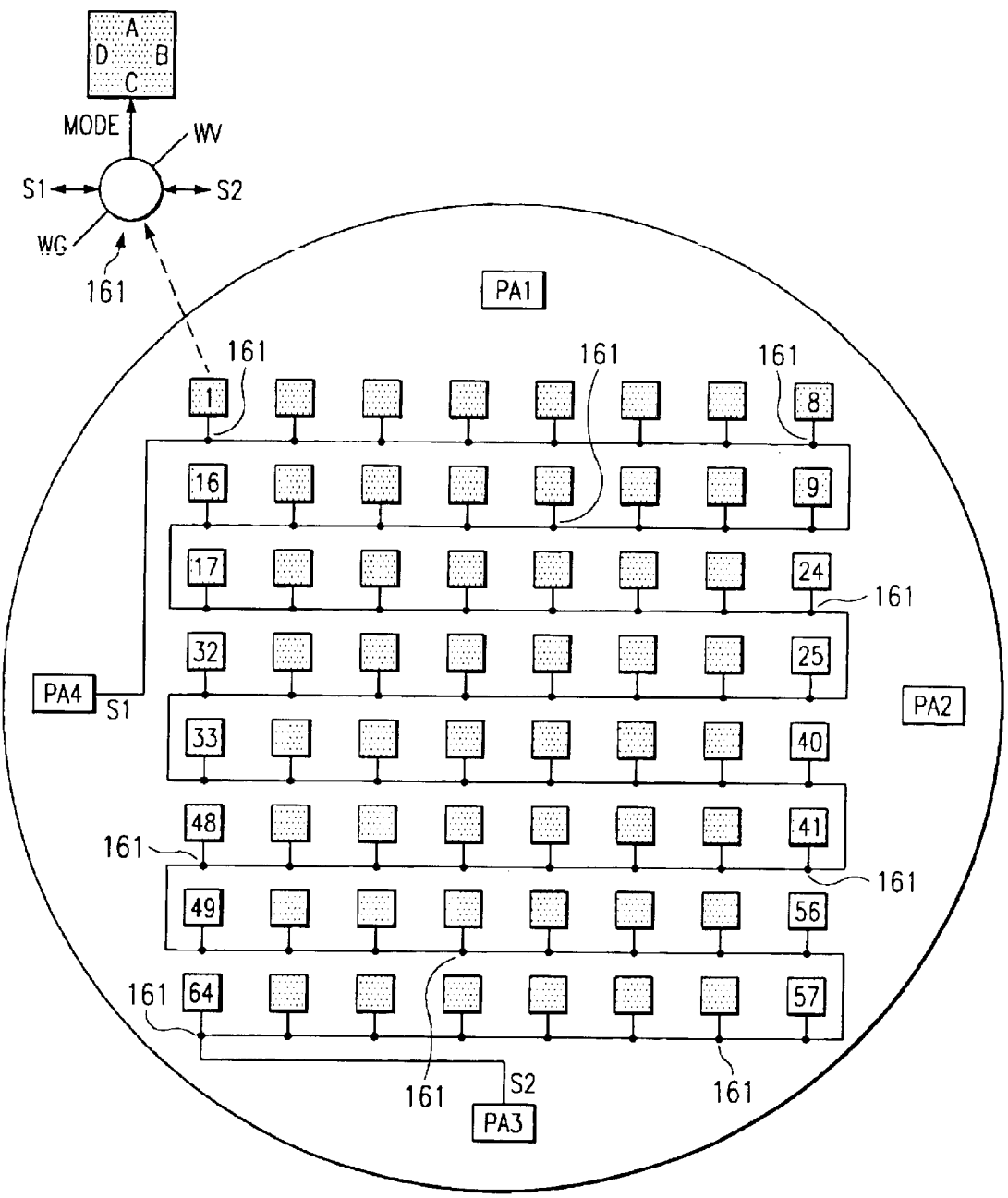
FIGS. 16A–16B illustrate an exemplary die selection scheme according to the present invention.

FIG. 16A illustrates an exemplary scheme for performing fault tolerant selection of unsingulated die on wafer. The scheme involves the placement of a small circuit, referred to as a die selector 161, in the scribe lane adjacent each die on the wafer. The die selector 161 shown in FIG. 16B includes an I/O terminal S1, an I/O terminal S2, a mode output terminal, and connections to WV and WG for power. The die selector's mode output is connected to the mode pad of an associated die. The die selectors are connected in series via their S1 and S2 terminals. In the example of FIG. 16A, S1 of the first die selector in the series (at die 1) is connected to PA4, and S2 of the last die selector in the series (at die 64) is connected to PA3. Because the die selector is placed in the scribe lane instead of on the die, the mode pad of the die can be physically probed if required, to override the die selector mode output. This feature permits any die to be tested using the conventional probe testing technique. Because the mode output of the die selector drives only the mode pad of a single die, it can be designed with a relatively weak output drive so that the conventional probe tester can easily override the mode output without any damage to the mode output.

Power is applied to WV and WG by probing PA1–PA4. When power is first applied, all the die selectors get reset to a state that forces their mode outputs low, which causes all die to be placed in bypass mode. If excess current is detected at power up (indicating perhaps a short between WV and WG), the wafer can be powered down and tested using the traditional mechanical probing technique (note that the diodes of FIG. 15B allow for this). If normal current is detected (meaning that all die have successfully powered up in bypass mode) further testing according to the present invention may be performed.

Before testing die, the integrity of the serially connected die selectors 161 can be tested. Testing of the die selectors can occur by injecting clock pulses from PA4 to S1 of the upper left die selector (adjacent die 1) and monitoring S2 of the lower left die selector (adjacent die 64) at PA3. If the serial path between the die selectors is intact, a clock pulse output will occur on lower left S2 after 65 clock pulses have been applied to upper left S1. On the falling edge of the first injected clock pulse, die 1 is switched from bypass mode to functional mode by the mode output of the associated die selector going high. All other die are forced to remain in bypass mode by their die selectors' mode outputs being low. Also on the falling edge of the first injected clock pulse, the upper left die selector connects its S1 and S2 terminals so that subsequent S1 clocks are output on S2. On the rising edge of the second injected clock pulse, die 1 is placed back into bypass mode by its die selector's mode output going low. This second clock pulse is transferred through the upper left die selector to the next die selector via the S1 to S2 connection. On the falling edge of the second clock pulse, the die 2 selector connects its S1 and S2 terminals and switches die 2 from bypass to functional mode by driving the mode output high. This process continues on to die 64 and its die selector. On the rising edge of the 65th injected clock pulse, die 64 is placed back into the bypass mode by its die selector's mode output going low, and the 65th clock pulse is output from S2 to PA3.

Also, during the die selector test the current flow to and/or from the wafer via WV and WG can be monitored during each rising and falling clock edge to see if the expected current increase and decrease occurs as each die transfers in sequence between bypass and functional modes. By sensing the wafer current fluctuations, it is possible to detect when a die that should be selected (i.e. in functional mode) is not selected, which could indicate a defect in the die selector arrangement as discussed further below.

Figure 17A:
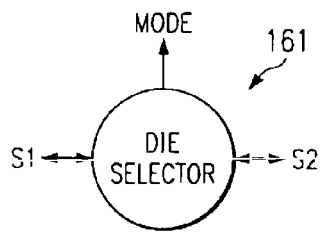
FIGS. 17A–17B illustrate the operation of the die selectors of FIG. 16A.
Figure 17B:
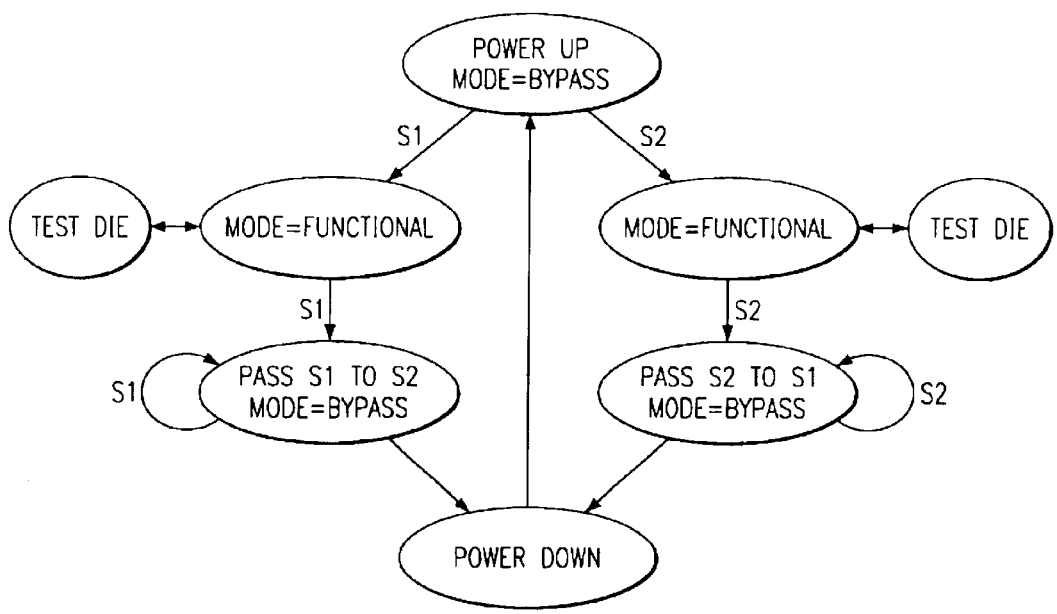

The above description illustrates how to test and operate the die selector path from PA4 to PA3. The same test and operation mode is possible by clocking S2 of the lower left die selector from PA3 and monitoring S1 of the upper left die selector at PA4. The die selector model of exemplary FIG. 17A and state diagram of exemplary FIG. 17B illustrate die selector operation modes in detail. From FIG. 17B it is seen that the die selector responds to a first received S1 or S2 clock pulse to output mode control (on the falling edge) to place the connected die in functional mode so that it can be tested. After the die is tested, a rising edge on the same signal (say S1) causes the tested die to be placed back into bypass mode and also drives the S1 input of the next die selector. On the next successive falling edge the die associated with the next die selector is switched into functional mode for testing. And so on.

Figure 19A:
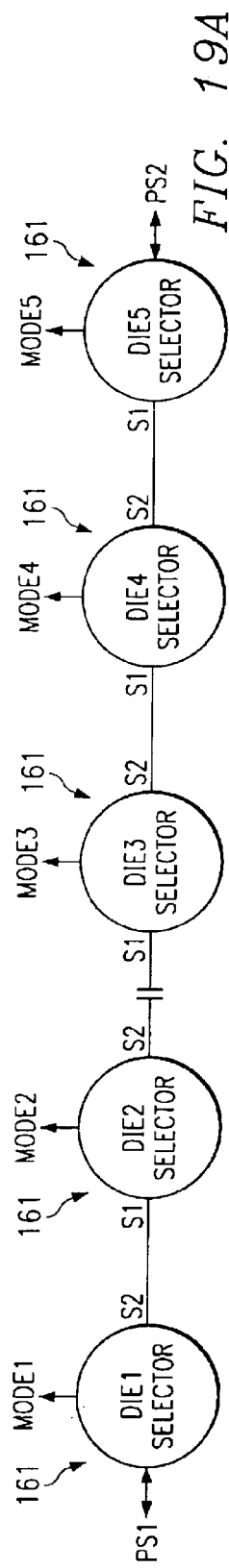
FIGS. 19A–19C illustrate a fault tolerant feature of the die selection scheme of FIG. 16A.
Figure 19B:
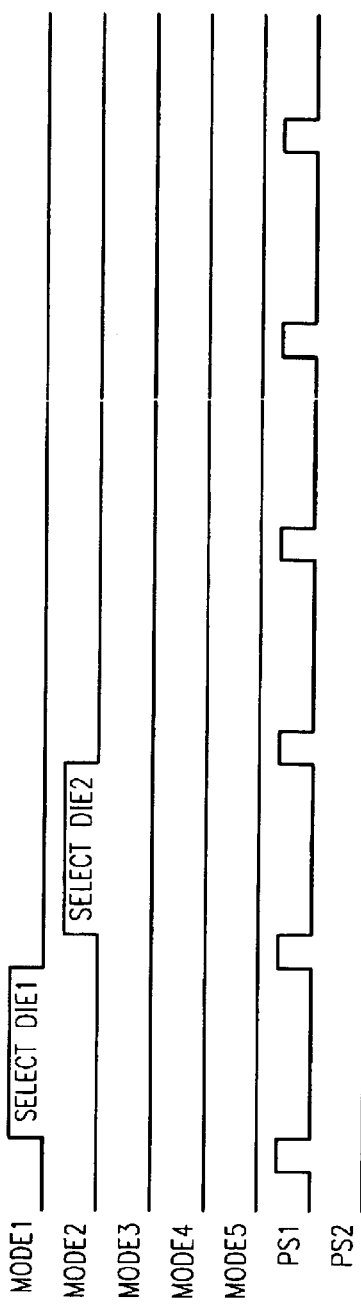
Figure 19C:
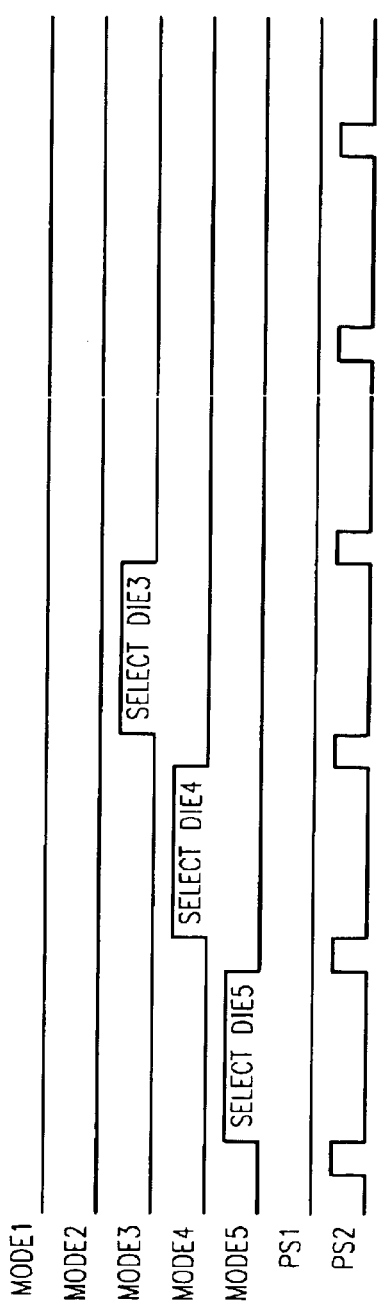

Exemplary FIGS. 18A–18C illustrate in detail the die selector operation described above. PS1 and PS2 in FIG. 18 are externally accessible terminals (like PA3 and PA4) for injecting and receiving clock pulses. Note that the die selectors operate bidirectionally as mentioned above. The reason for the bidirectional operation is for fault tolerance, i.e. a broken connection between two die selectors can be tolerated. An example of the fault tolerant operation of the die selector is shown in FIGS. 19A–19C. In FIG. 19A an open circuit fault exists between the 2nd and 3rd die selectors. PS1 clock activations can only select die 1 and 2 (FIG. 19B). However, PS2 clock activations can select die 5, 4, and 3 (FIG. 19C). Thus even with an open circuit the die selector arrangement is able to select and place a given die in functional mode for testing.

Figure 19D:
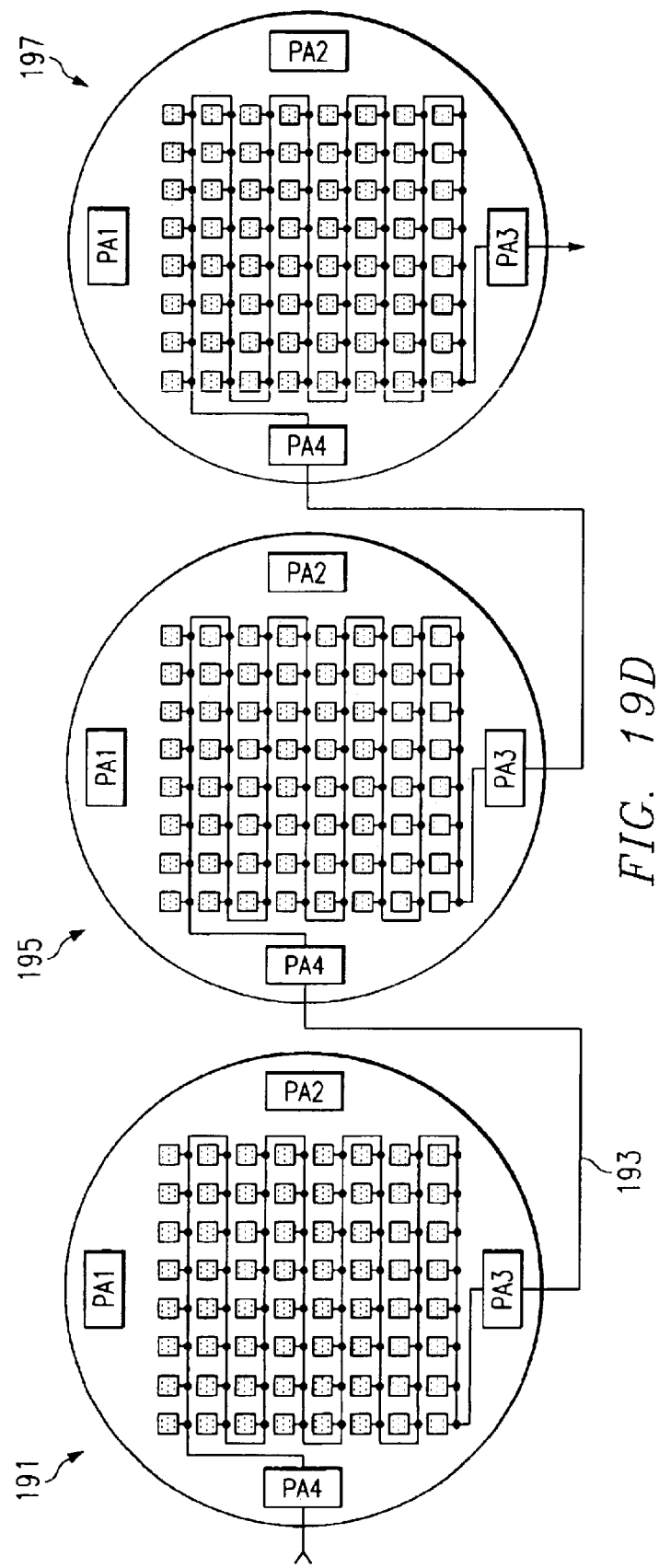
FIG. 19D illustrates the die selection scheme of FIG. 16A applied to a plurality of die on a plurality of wafers.

Wafers such as shown in FIG. 16A may also be connected in series via the S1/S2 signals to allow selection of die on many wafers as shown in FIG. 19D. S2 of the lower left die of wafer 191 is connected, via PA3 of wafer 191 and external conductor 193 and PA4 of wafer 195, to S1 of the upper left die of wafer 195. An analogous connection also exists between wafers 195 and 197. External probe connections at PA4 of wafer 191 and PA3 of wafer 197 permit the die selection scheme described above with respect to FIGS. 16A–18C to be applied to die on plural wafers.

Exemplary FIGS. 20 and 21 illustrate how to further improve die selector fault tolerance by the addition of a second pair of I/O terminals S3 and S4 in die selector 201.

Figures 20A, 20B:
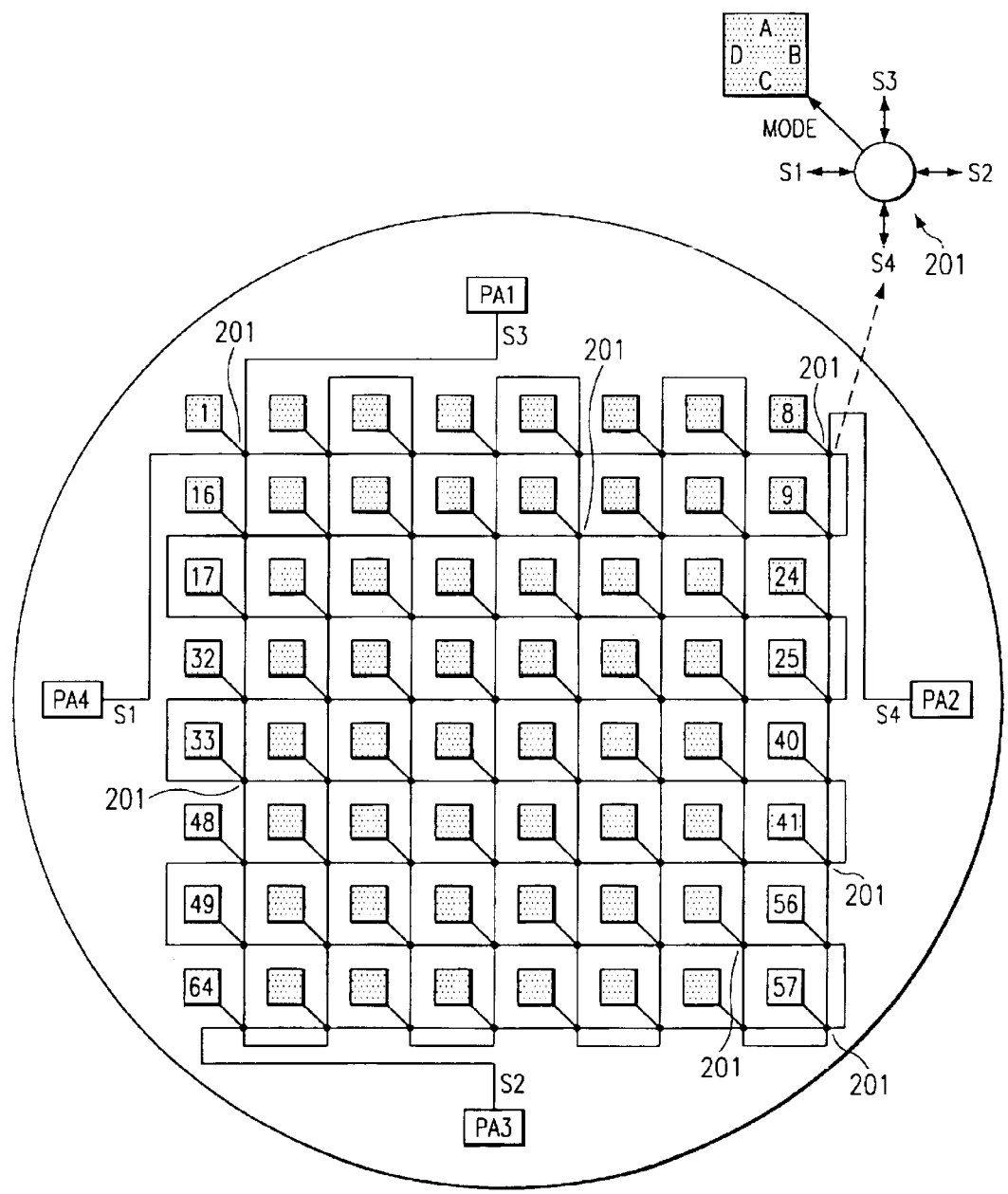
FIGS. 20A–20B illustrate another exemplary die selection scheme according to the present invention.
Figure 22B:
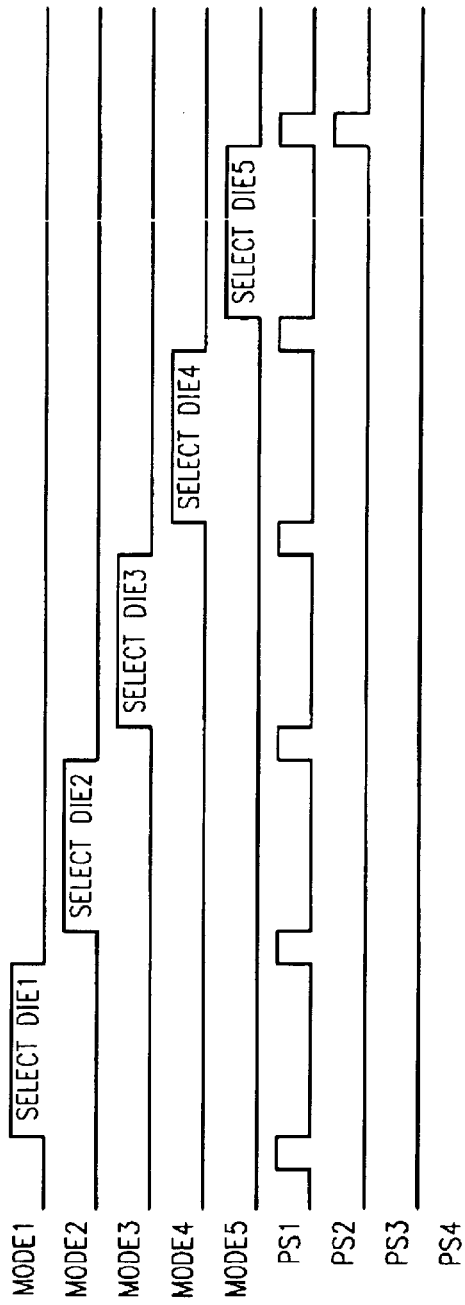
FIGS. 22A–23B illustrate the structure and operation of the die selection scheme of FIG. 20A.
Figure 22C:
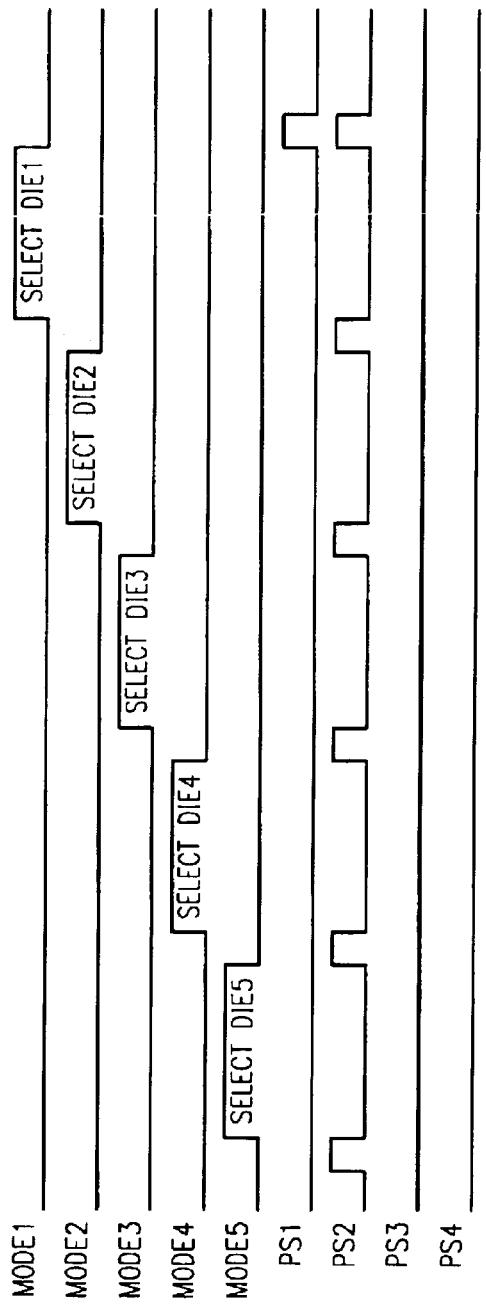

In FIG. 20A, the S3 and S4 serial connection path is shown routed between PA1 and PA2 in the vertical scribe lanes. Separating the S1/S2 (horizontal scribe lanes) and S3/S4 (vertical scribe lanes) routing is not required, and both routings could be in the same horizontal or vertical lanes if desired. It is clear in the example of FIG. 20A that routing S1 and S2 in the horizontal lanes and routing S3 and S4 in the vertical lanes will result in different die selection orders, i.e. S1 and S2 select die order 1, 2, 3 . . . 64 or die order 64, 63, 62 . . . 1, whereas S3 and S4 select die order 1, 16, 17, . . . 64 . . . 8 or die order 8, 9, 24 . . . 1.

Exemplary FIGS. 21A and 21B illustrate the model and state diagram of the improved fault tolerant die selector 201 of FIGS. 20A and 20B. The operation of the die selector 201 of FIG. 21A is similar to that of the die selector 161 of FIG. 17A except that the die selector 201 has redundant bidirectional selection paths. Redundant selection paths allow the die selector 201 to maintain operation even when one of its selection paths is rendered inoperable by gross defects that defeat the fault tolerance features provided in the single path die selector 161 of FIG. 17A.

In FIGS. 22A–24C operational examples using dual selection path die selectors 201 are shown. For clarity, the examples show both paths (S1 and S2, and S3 and S4) routed together (in same scribe lanes) to the same sequence of die 1 through 5. This differs from the example routing of FIG. 20A where S1 and S2 are routed in horizontal lanes and S3 and S4 are routed in vertical lanes, and thus each path has a different sequence of die selection. FIG. 22B shows PS1 selecting die in the order 1, 2, 3, 4 & 5. FIG. 22C shows PS2 selecting die in the order 5, 4, 3, 2 & 1. FIG. 23A shows PS3 of FIG. 22A redundantly selecting die in the same order as PS1 (FIG. 22B). FIG. 23B shows PS4 of FIG. 22A redundantly selecting die in the same order as PS2 (FIG. 22C). Both paths can tolerate a single defect (open circuit) as shown in FIGS. 19A–19C.

Figure 23A:
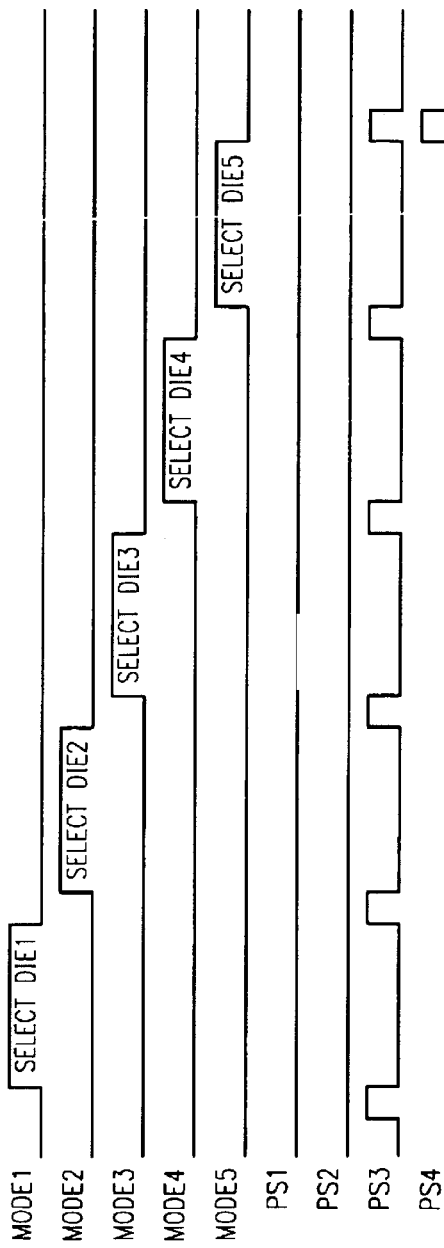
Figure 23B:
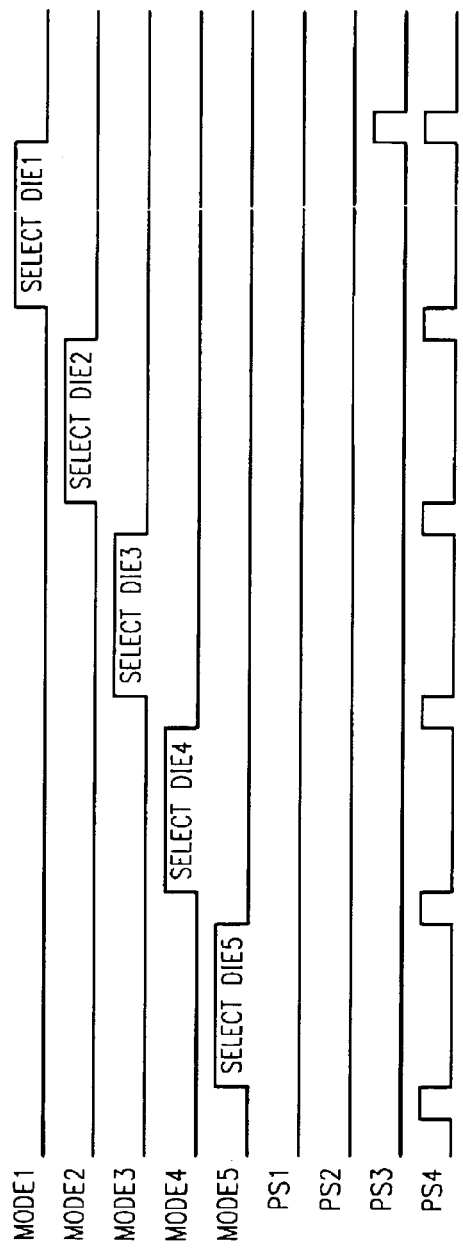

However, FIG. 24A shows a multiple defect example (two open circuits) on the S1 and S2 path that would disable access to intermediate die 2, 3 & 4 if only the S1 and S2 path were provided. FIGS. 24B–24C illustrate that PS1 can only select die 1, and PS2 can only select die 5 with the defects shown in FIG. 24A. However, since redundant selection paths are provided in the die selectors 201 of FIG. 24A, the S3 and S4 path can be used to select die 2, 3 & 4 as illustrated in FIGS. 23A–23B. Thus an advantage of die selector 201 is that it can maintain access to die even if one of the paths is critically disabled by multiple defects.

Figure 24D:
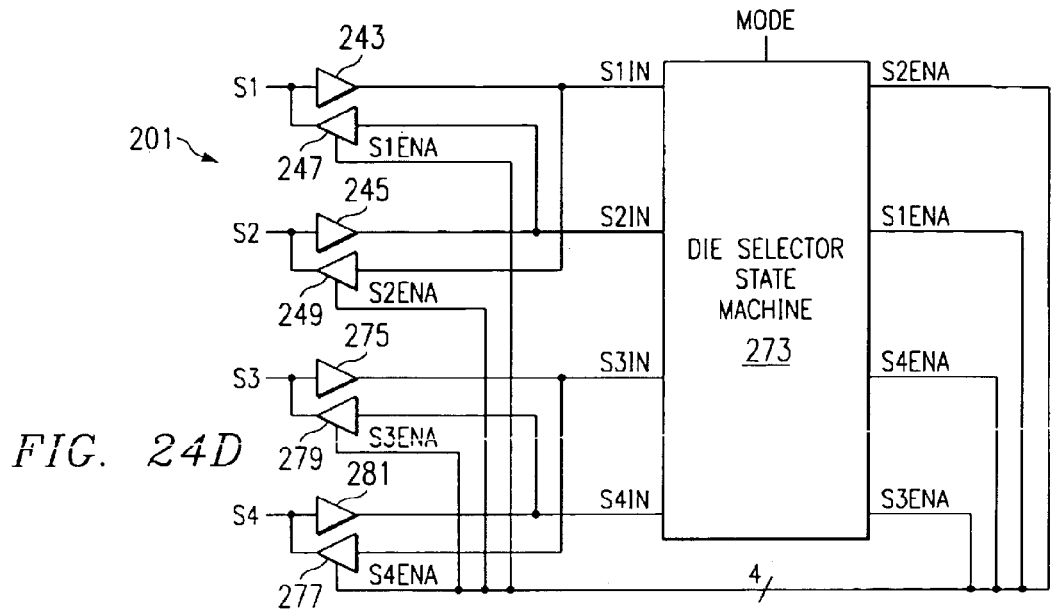
FIGS. 24D and 24E diagramatically illustrate an exemplary implementation of the die selector defined in FIGS. 21A–23B.
Figure 24E:
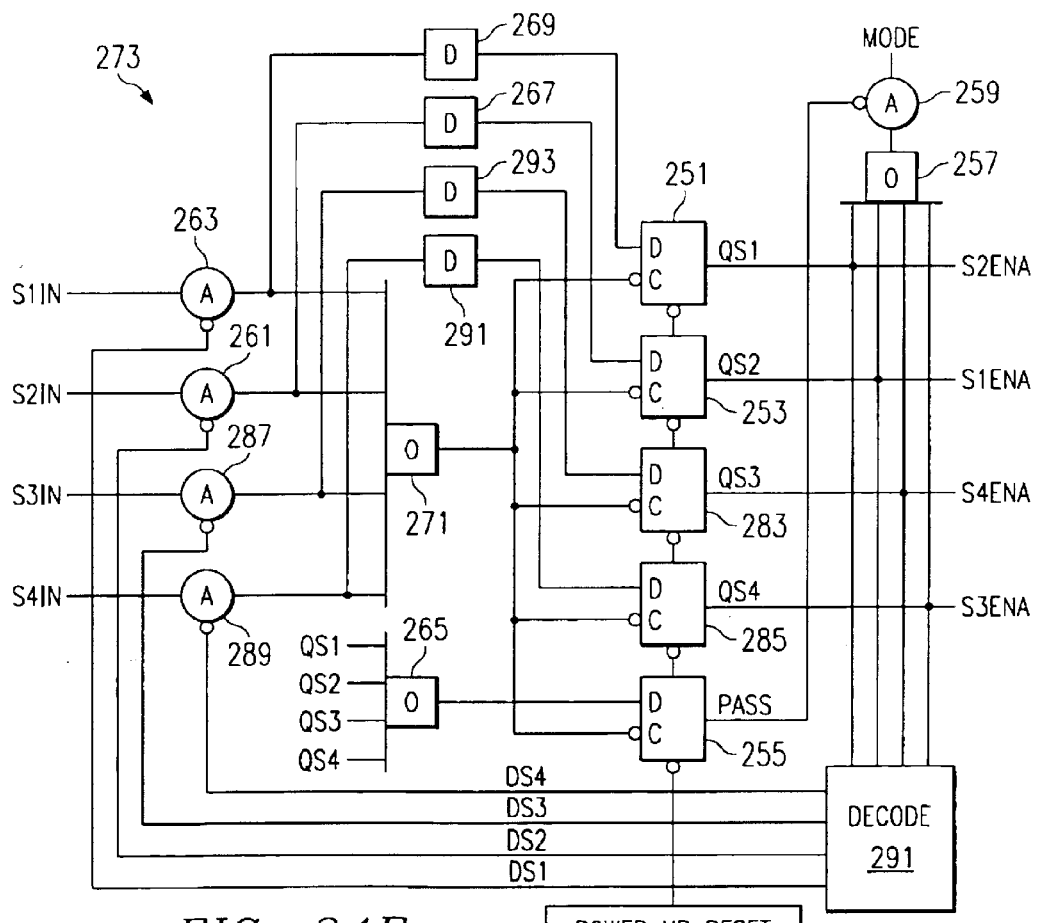
Figure 24F:
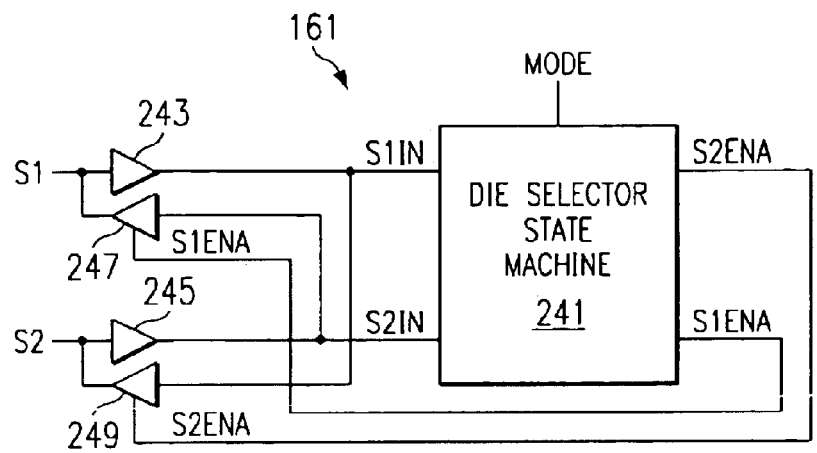
FIGS. 24F and 24G diagrammatically illustrate an exemplary implementation of the die selector defined in FIGS. 17A–18C.
Figure 24G:
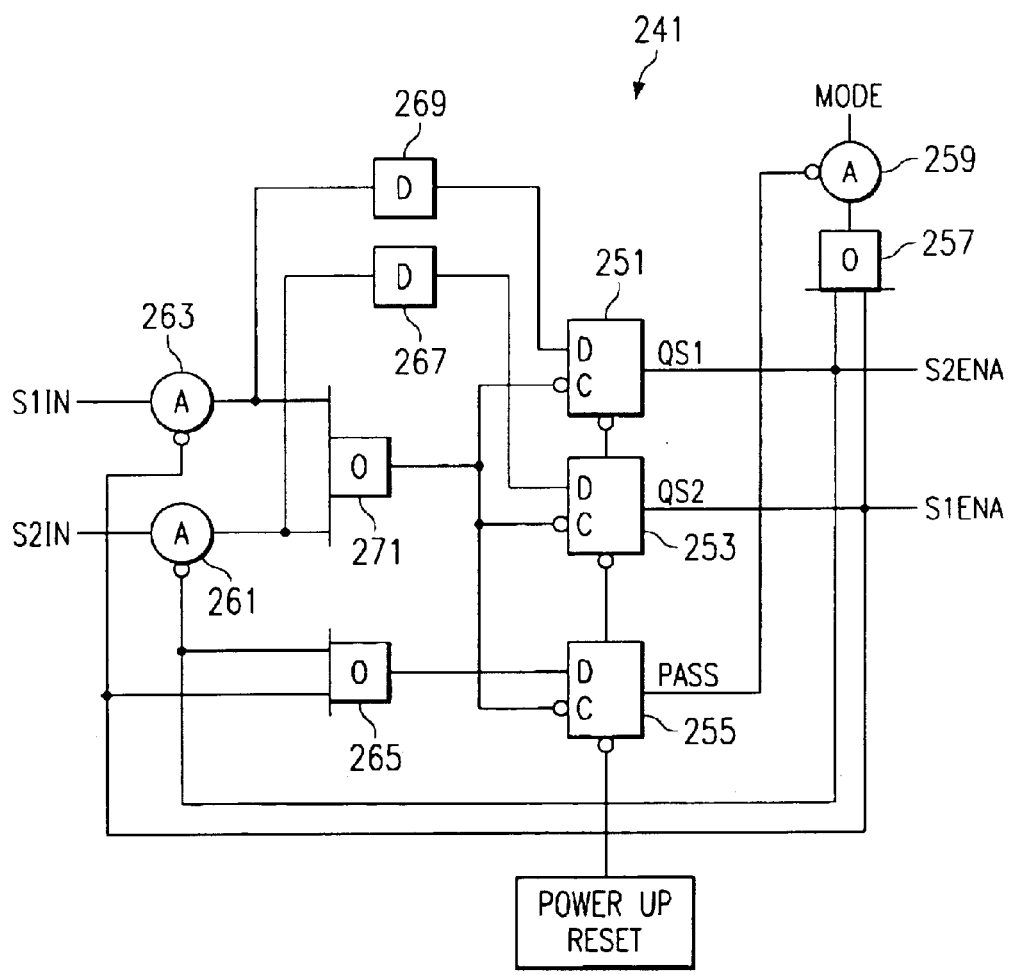

FIGS. 24F and 24G illustrate an exemplary implementation of the die selector 161 defined in FIGS. 17A–18C. In FIG. 24F, input terminals S1 and S2 are respectively connected to inputs S1IN and S2IN of a die selector state machine 241 via respective input data buffers 243 and 245. The die selector state machine 241 outputs the mode signal and enable signals S1ENA and S2ENA. Enable signals S1ENA and S2ENA respectively control output data buffers 247 and 249. The output of input data buffer 243 is connected to the input of output data buffer 249 to permit signals received at terminal S1 to be output on terminal S2 when enable signal S2ENA enables output data buffer 249. Similarly, the output of input data buffer 245 is connected to the input of output data buffer 247 to permit signals received at terminal S2 to be output on terminal S1 when enable signal S1ENA enables output data buffer 247.

Exemplary FIG. 24G illustrates the die selector state machine 241 of FIG. 24F in greater detail. A conventional power-up reset circuit initially clears D flip-flops 251, 253 and 255 when the die selector is initially powered up. The pass signal output from flip-flop 255 is inverted at one input of AND gate 259. The other input of AND gate 259, which is driven by the output of OR gate 257, is thus qualified at gate 259 by the pass signal upon initial power up. Because flip-flop outputs QS1 and QS2 are low after initial power-up, the mode signal is therefore low after power-up. Noting that QS1 is connected to S2ENA and QS2 is connected to S1ENA, it is seen from FIG. 24F that output data buffers 247 and 249 are initially disabled after power-up. Because signal QS1 is initially low, signal S2IN is initially qualified at AND gate 261, and because signal QS2 is initially low, signal S1IN is also initially qualified at AND gate 263. The low levels of QS1 and QS2 also drive the D input of flip-flop 255 low via OR gate 265. The outputs of AND gates 261 and 263 are connected to respective inputs of OR gate 271 whose output drives the clock inputs of flip-flops 251, 253 and 255. The output of AND gate 261 is connected to the D input of flip-flop 253 via delay element 267, and the output of AND gate 263 is connected to the D input of flip-flop 251 via delay element 269. Delay elements 267 and 269 are designed to have a propagation delay which is greater than the propagation delay of OR gate 271.

A rising edge of a first clock pulse on S1IN causes a logic zero to be clocked through flip-flop 255, thereby maintaining the pass signal at its initial low state. When the falling edge of the clock pulse occurs and propagates through OR gate 271 to clock flip-flop 251, the D input of flip-flop 251 will still be high due to the delay element 269, thus causing flip-flop output QS1 to go high. With QS1 high, the mode signal is driven high via OR gate 257 and AND gate 259. Also with QS1 high, the output data buffer 249 of FIG. 24F is enabled via signal S2ENA, the input S2IN is disqualified at AND gate 261, and the D input of flip-flop 255 is driven high via OR gate 265. Thus, the rising edge of the second clock pulse on terminal S1 of FIG. 24F passes directly to terminal S2 via output data buffer 249, and also passes through AND gate 263 and OR gate 271 of FIG. 24G to clock flip-flop 255 and take the pass output thereof high, thereby driving the mode signal low. The next falling edge on terminal S1 will pass through data output buffer 249 to terminal S2, and will maintain the QS1 output of flip-flop 251 in the high logic state. The positive edge of the third clock pulse received on terminal S1 will pass through data output buffer 249 to terminal S2, and will also clock a logic one through flip-flop 255 so that the pass signal will maintain the mode output low via AND gate 259. The negative edge of the third clock pulse will maintain the logic one at the QS1 output of flip-flop 255. Each successive clock pulse after the third clock pulse on terminal S1 will achieve the same results as described with respect to the third clock pulse.

The bidirectional feature of die selector 161 should be apparent from FIGS. 24F and 24G. That is, if a succession of clock pulses had occurred on terminal S2 rather than on terminal S1, then output QS2 of flip-flop 253 would have been driven high to enable data output buffer 247 and disable the S1IN signal via AND gate 263. The mode signal behaves exactly the same in response to a succession of clock pulses on terminal S2 as described above with respect to the succession of clock pulses on terminal S1, and the terminal S1 will receive the second and all successive clock pulses input on terminal S2.

Exemplary FIGS. 24D and 24E show an implementation of die selector 201 which is similar to the implementation of die selector 161 illustrated in FIGS. 24F and 24G. Referencing FIG. 24D, the output of data input buffer 243 is connected to the input of data output buffer 249 as in FIG. 24F, and the output of data input buffer 245 is connected to the input of data output buffer 247 as in. FIG. 24F. Similarly, the output of data input buffer 275 is connected to the input of data output buffer 277, and the output of data input buffer 281 is connected to the input of data output buffer 279.

The die selector state machine 273 of FIG. 24D is shown in greater detail in FIG. 24E. As seen from FIG. 24E, the die selector state machine 273 of FIG. 24D represents an extension of the die selector state machine of 241 of FIG. 24G. An additional AND gate 287, delay element 293, and flip-flop 283 have been added for terminal S3, and an additional AND gate 289, delay element 291 and flip-flop 285 have been added for terminal S4. The operation of these additional elements is identical to the operation described above with respect to the corresponding elements in FIG. 24G. Similarly to the operation described above with reference to FIG. 24G, a first falling clock pulse edge on terminal S3 will result in the QS3 output of flip-flop 283 going high to drive the mode signal high and to enable the data output buffer 277 to connect terminal S3 to terminal S4. The rising edge of the second clock pulse on terminal S3 will clock a logic one through flip-flop 255 so that the pass signal will drive the mode signal low again via AND gate 259. Similarly, the falling edge of a first clock pulse on terminal S4 will drive high the QS4 output of flip-flop 285, which drives the mode signal high and enables data output buffer 279 to connect terminal S4 to terminal S3. The decoder circuit 291 receives QS1–QS4 as inputs and provides DS1–DS4 as outputs. When QS1 is active high, the decoder circuit 291 drives DS2–DS4 active high, which disables signals S2IN, S3IN and S4IN at AND gates 261, 287 and 289. Similarly, when signal QS2 is active high, the decoder circuit drives signals DS1, DS3 and DS4 active high, when signal QS3, is active high, the decoder circuit drives signals DS1, DS2 and DS4 active high, and when QS4 is active high, the decoder circuit drives signals DS1–DS3 active high.

Referencing exemplary FIGS. 25A and 25D, probe test pads in PA1 are bussed (via A-Bus) to one side of eight top column switch groups (TC1–8), representative switch group TC8 being shown in FIG. 25D. Each top column switch group also receives a select top column signal (such as STC8) from PA1 that opens or closes the switches. The other side of each top column switch group is bussed to the A side (recall FIG. 5) pads of die 1, 2, 3, 4, 5, 6, 7, and 8.

Also referencing FIG. 25C, probe test pads in PA2 are bussed (via B-Bus) to one side of eight right row switch groups (RR1–8), representative switch group RR8 being shown in FIG. 25C. Each right row switch group also receives a select right row signal (such as SRR8) from PA2 that opens or closes the switches. The other side of each right row switch group is bussed to the B side pads of die 8, 9, 24, 25, 40, 41, 56, and 57.

Referencing also FIG. 25E, probe test pads in PA3 are bussed (via C-Bus) to one side of eight bottom column switch groups (BC1–8), representative switch group BC1 being shown in FIG. 25E. Each bottom column switch group also receives a select bottom column signal (such as SBC1) from PA3 that opens or closes the switches. The other side of each bottom column switch group is bussed to the C side pads of die 57, 58, 59, 60, 61, 62, 63, and 64.

Referencing also FIG. 25B, probe test pads in PA4 are bussed (via D-Bus) to one side of eight left row switch groups (LR1–8), representative switch group LR1 being shown in FIG. 25B. Each left row switch group also receives a select left row signal (such as SLR1) from PA4 that opens or closes the switches. The other side of each left row switch group is bussed to the D side pads of die 1, 16, 17, 32, 33, 48, 49, and 64.

PA1–4, the switch groups, and bussing to correct them can all be located in the unusable peripheral area (recall FIG. 3A) of the wafer.

Figure 26:
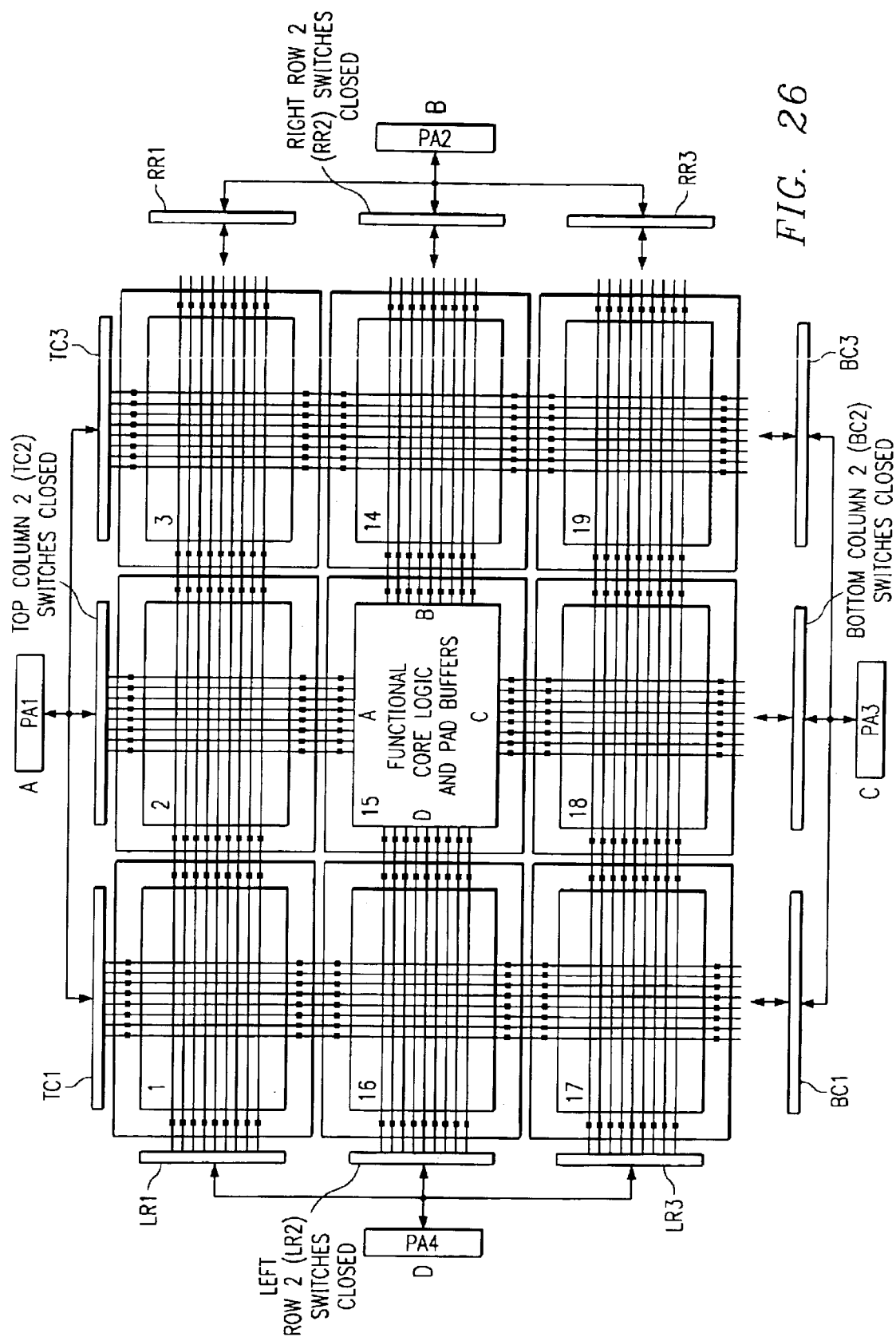
FIG. 26 illustrates a portion of FIG. 25A in greater detail.

As shown in the detailed example of FIG. 26, each die on the wafer, excluding the boundary die, such as die 1, 2, 3, 16, 17 etc. is connected at its top (A), right (B), bottom (C) and left (D) side pad sites to neighboring die pad sites by way of short busses that bridge across the scribe lanes between the die. Due to the regularity of the die and their positioning on the wafer, vertical pad bussing is provided between each neighboring die on sides A and C, and horizontal pad bussing is provided between each neighboring die on sides B and D. The pads of boundary die are similarly bussed to neighboring die pads, but only on at most three sides, since at least one of the boundary die sides will always be connected to a switch group.

Although not shown in FIG. 25A, the wafer also comprises: (1) die having selectable functional and bypass modes as described in FIGS. 5–14, (2) WV and WG bussing as shown in FIGS. 15A–15B, and (3) fault tolerant die selectors as described in FIGS. 16–24.

Each switch group, when selected (switches closed), provides a low impedance, bidirectional signaling path. Also the bussing connections between PA1–4 and the switch groups (TC1–8, LR1–8, BC1–8, RR1–8), between the switch groups and the die sides (A, B, C, D), and between the die sides, provide a low impedance, bidirectional signaling path. As previously mentioned, the die's internal bypass pad-to-pad connections also provide low impedance, bidirectional signaling paths.

When testing is to be performed, a probe is positioned onto the wafer at the pad areas PA1–4. PA1–4 are large compared to the pad area of each die, and therefore the mechanical requirements of the probe design are simpler ad less costly than conventional probes which are elegantly designed for contacting tiny die pads. Also, since the present invention allows for a die to be electronically selected for testing, the probe needs to be positioned onto the wafer only once, which reduces test time when compared to conventional multiple probing of a wafer. This test time reduction can significantly decrease the cost of wafer testing, which in turn decreases the cost of the die and packaged IC. Also, since the probe does not contact any die pads, no damage to die pads occurs during the wafer probe and die test procedure. Furthermore, the relatively large probe target area provided by PA1–4 lends itself well to computer controlled and automated test probing processes.

After the probe contacts the wafer at PA1–4, power is applied to the wafer to power up the die and die selectors. The tester can quickly detect a high current situation and remove power from the wafer as necessary. Wafer processing faults could cause shorts between WG and WV bussing or a die or die selector could have a V and G short. If the wafer fails the high current test at power up, die testing can still be done by conventional die probing techniques.

If the wafer exhibits normal current flow at power up, the die selectors can be tested as previously described with regard to FIGS. 16–24. If the die selectors fail in all fault tolerant modes, the wafer can still be tested conventionally. If the die selectors pass, the row and column bussing paths can be tested. To test row 1 and column 1 (FIGS. 25 and 26), the LR1, RR1, TC1 and BC1 switch groups are closed and, with all die in bypass mode, an external tester (such as in FIG. 4) passes signals between PA4 and PA2 to test row 1 bussing and between PA1 and PA3 to test column 1 bussing. This step tests, (1) the PA1–4 to switch group bussing, (2) the switch group closures, (3) the switch group to boundary die bussing, (4) the die bypass mode, and (5) the die-to-die pad bussing. This step is repeated on all rows and columns. If a row or column fails, die associated with that row and column can be tested conventionally. After testing row and column connectivity, the die can be tested.

The die test starts by outputting a first pulse to S1 (could be S2, or S3 or S4 if die selector 201 is used) from PA4 to cause the upper left die selector to switch die 1 from bypass to functional mode, and then closing switch groups LR1, TC1, RR1 and BC1, and then testing die 1 using the external tester which is connected to die 1 via PA1-4, the closed switch groups and the row 1 and column 1 bussing paths. This test sequence is repeated on all die on the wafer. FIG. 26 illustrates in detail the testing of die 15 via the row 2 and column 2 bussing paths. Different types of testing can be performed on a selected die. A first test is a DC test where the objective is to verify the I/O parametrics and the logical correctness of the die. A second test is a functional test wherein the die is functionally tested at its intended operating speed. Some high reliability applications require an environmental (or burn in) test where the die is tested in chambers where temperature, humidity, and vibration can be cycled during testing. Die that pass DC testing may fail functional and environmental testing, so at wafer level it is important to test die in DC, functional, and perhaps environmental test mode to prevent bad die from being packaged into IC form or assembled on MCMs.

To perform die testing, it is important to provide relatively high performance bussing paths, i.e. all the wafer routed bussing, the die bypass mode pad-to-pad connectivity bussing, and the switch group switches are preferably designed for low impedance and bidirectional signaling. In the die 15 test example of FIG. 26, the D and A sides of die 15 receive test signaling from PA4 and PA1 through only bypassed die 16 and 2 respectively, whereas test signaling at sides B and C of die 15 must traverse more than one bypassed die (see FIG. 25A) before arriving from PA2 and PA3, respectively. The die bypass signaling delay and die-to-die bussing delays can easily be modeled in tester software so that the tester can compensate for the delays through row and column bussing paths that traverse different numbers of die in bypass mode. In this way, test signaling between the tester and target die under test will occur correctly, independent of the number of bypassed die that exists in the row and column bussing paths connected to the A, B, C, and D sides of the die under test.

Figure 27:
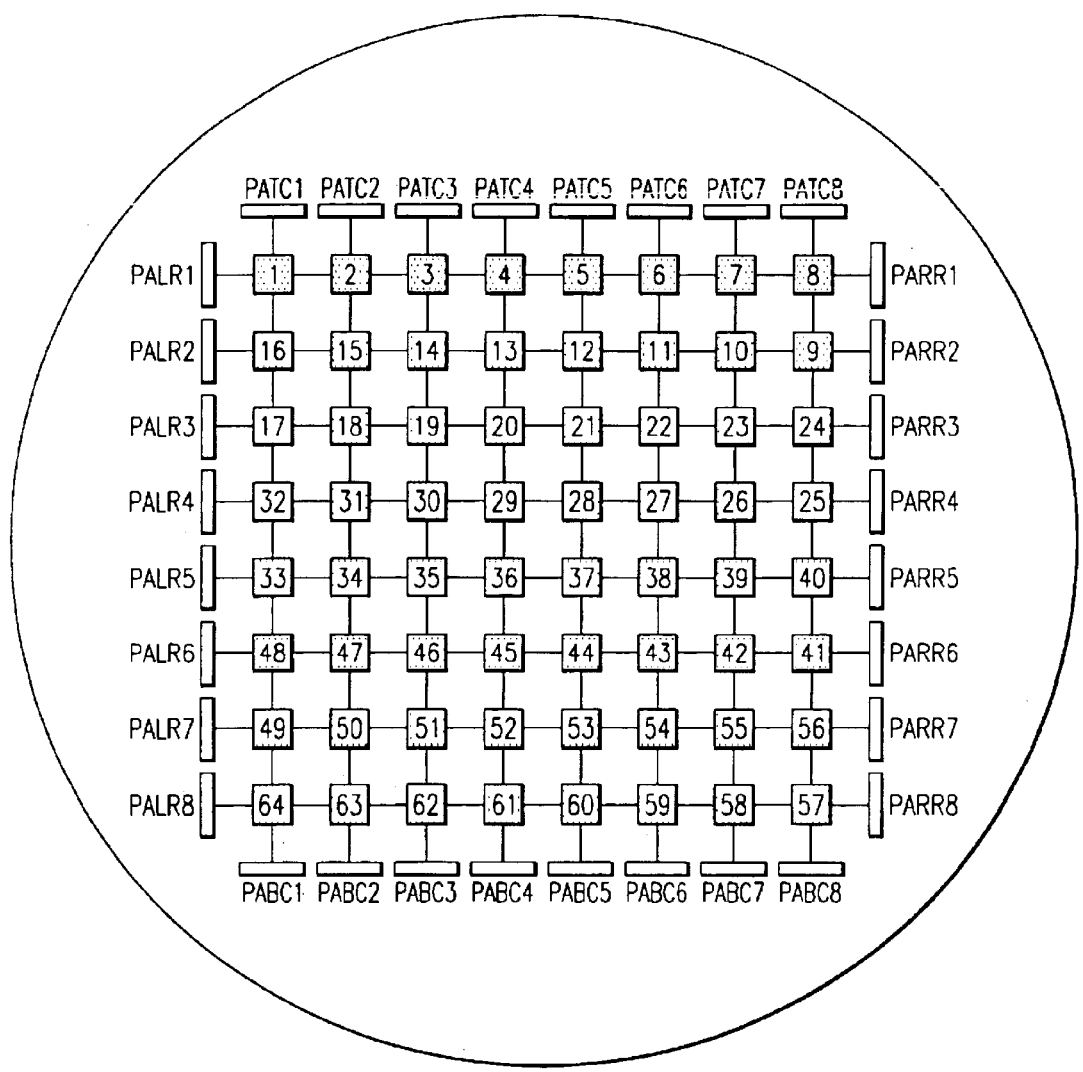
FIG. 27 illustrates an exemplary arrangement according to the present invention for testing a plurality of die on wafer in parallel.
Figure 28:
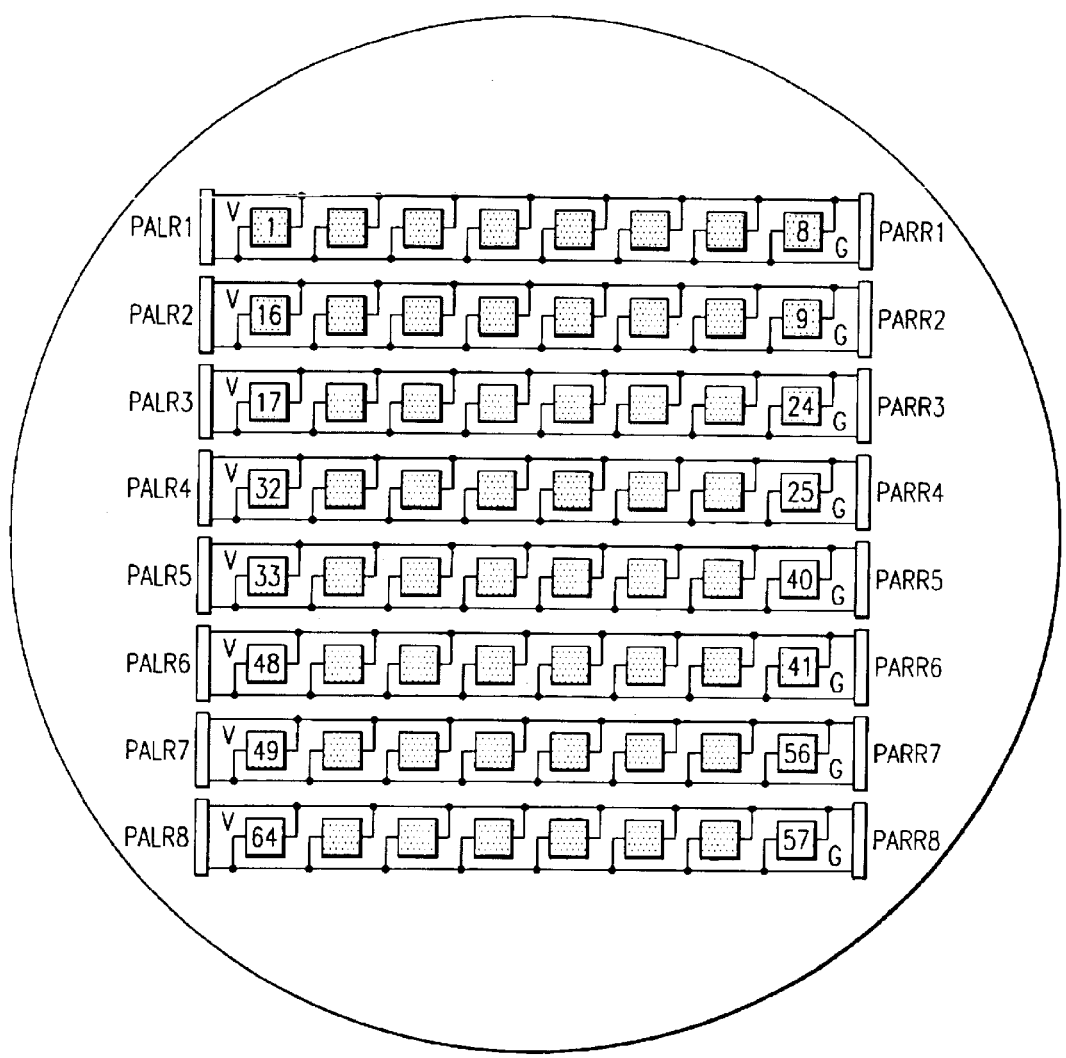
FIG. 28 illustrates an exemplary power and ground bussing arrangement for use with the testing arrangement of FIG. 27.
Figure 29:
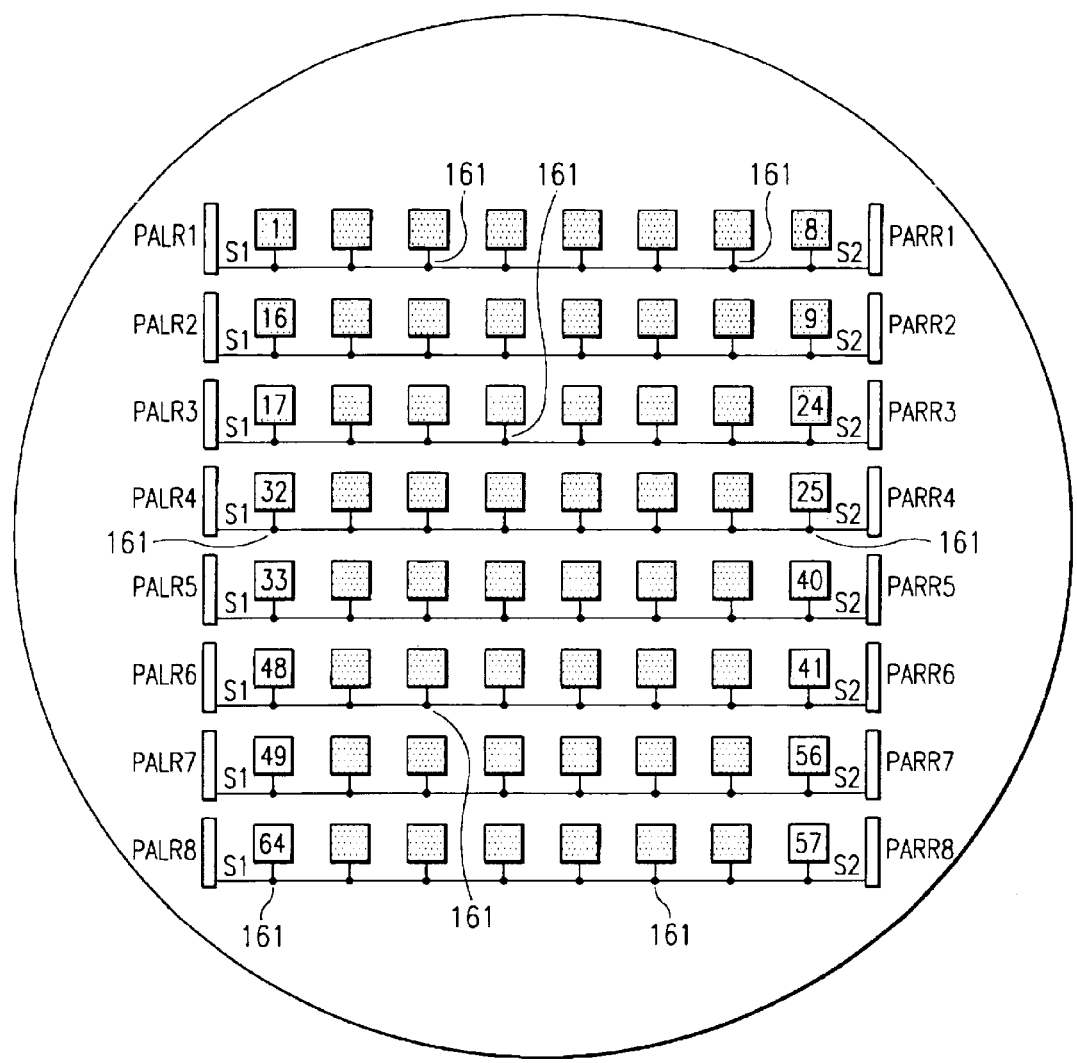
FIG. 29 illustrates an exemplary die selection scheme for use with the testing arrangement of FIG. 27.

In exemplary FIG. 27, a wafer bussing structure is shown where each row and column has its own pair of probe areas. For example probe area left row 1 (PALR1) and probe area right row 1 (PARR1) serve as the row 1 probe areas, and probe area top column 1 (PATC1) and probe area bottom column 1 (PABC1) serve as the column 1 probe areas. The die-to-die bussing is the same as described previously relative to FIGS. 25–26. Also the probe areas can exist in the unused peripheral area of the wafer. Optionally, the probe areas could be eliminated altogether and the pad sites at the A, B, C and D sides of the top, right, bottom, and left boundary die could be probed if desired. FIG. 28 illustrates an example of how each row can be supplied, via its left and right probe areas PALRn and PARRn, with a unique V and G connection. FIG. 29 illustrates how each row can be supplied, via its left and right probe areas PALRn and PARRn, with a unique die selector signaling connection. The power and die selector connections could also be arranged column-wise so that PATCn and PABCn would provide each column with unique power supply and die selection.

Figure 30:
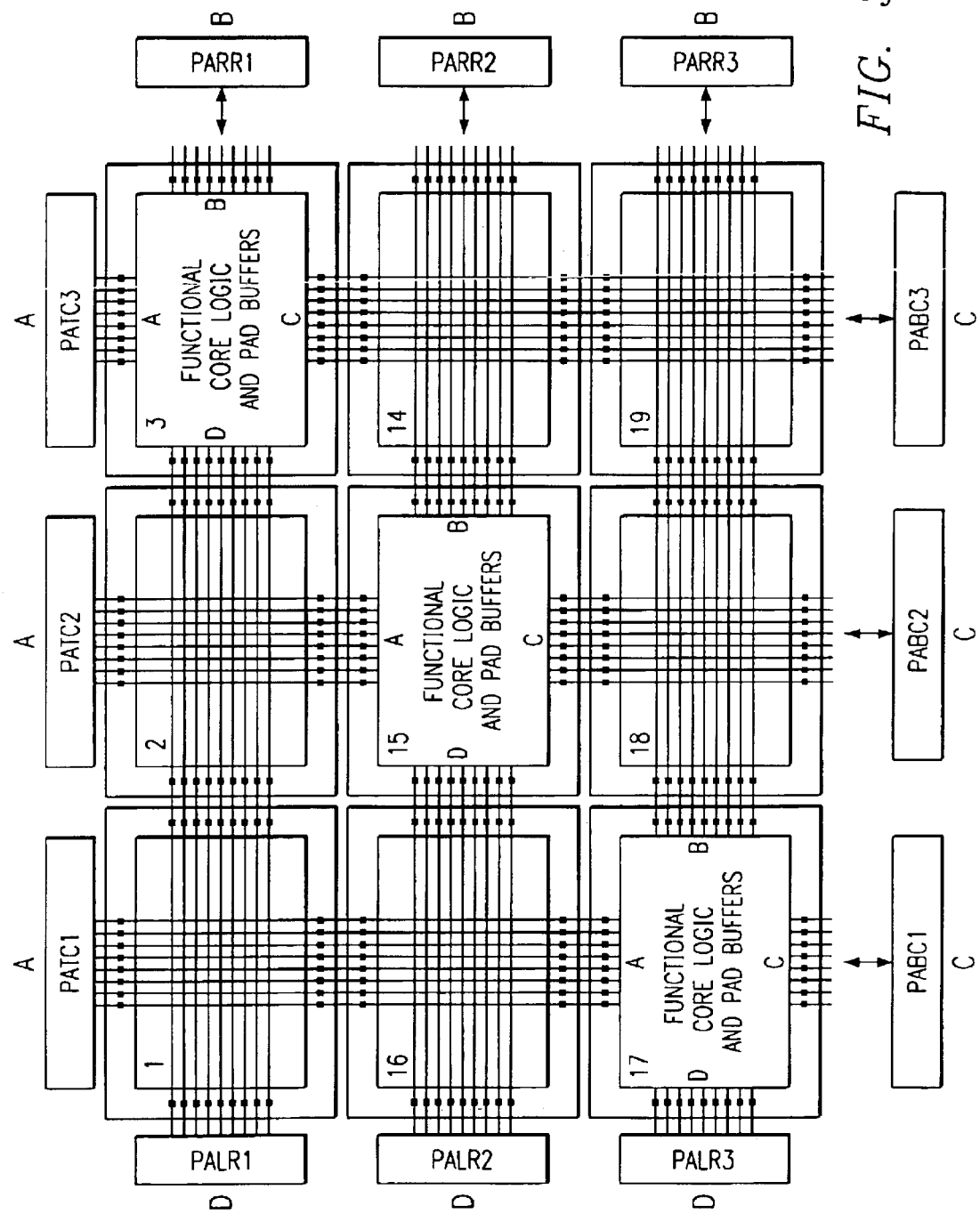
FIG. 30 illustrates a portion of FIG. 27 in greater detail.
Figure 31A:
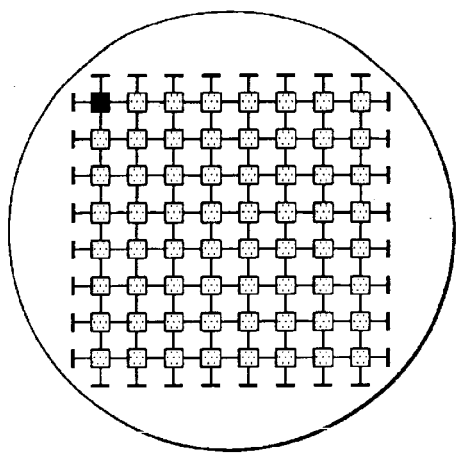
FIGS. 31A–31O illustrate a sequence of testing steps supported by the arrangement of FIG. 27, wherein groups of diagonally positioned die are tested in parallel fashion.
Figure 31B:
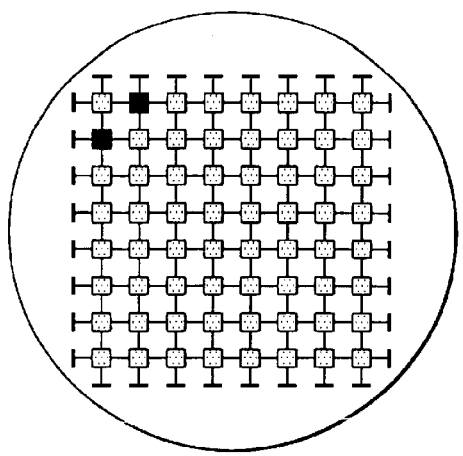
Figure 31C:
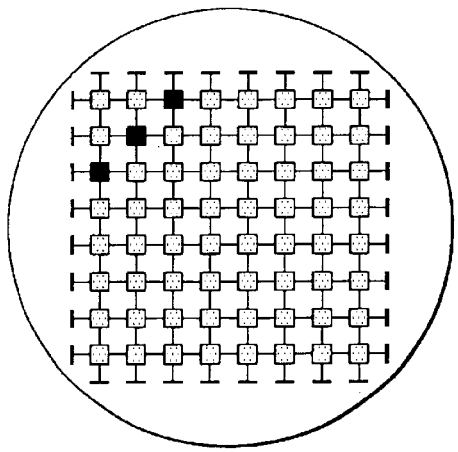
Figure 31D:
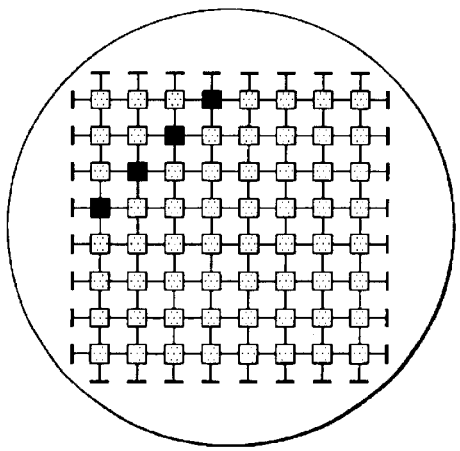
Figure 31E:
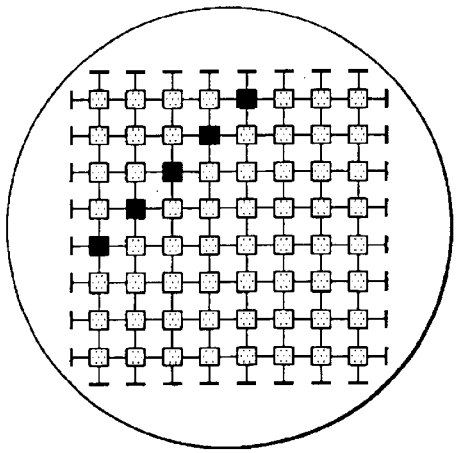
Figure 31F:
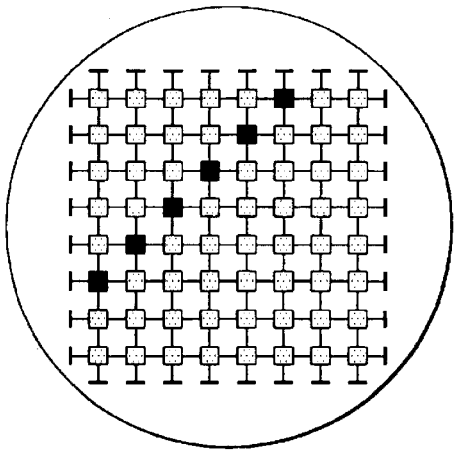
Figure 31G:
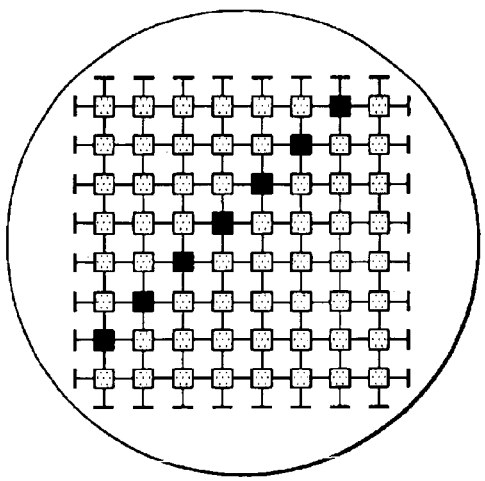
Figure 31H:
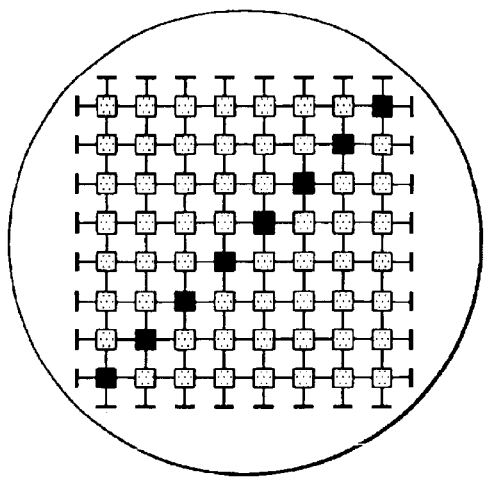
Figure 31I:
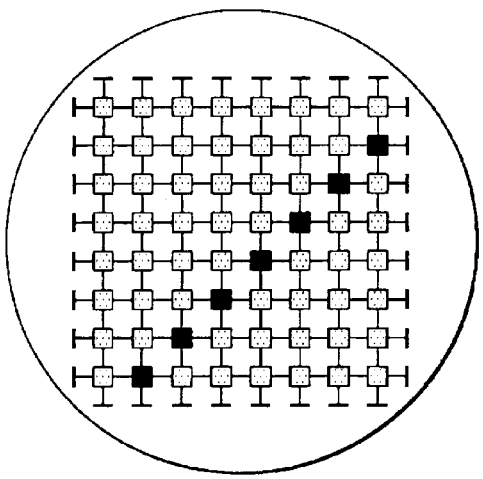
Figure 31J:
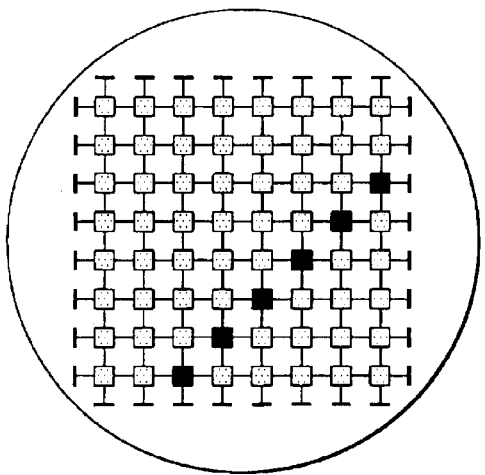

Exemplary FIG. 30 illustrates in detail how diagonally positioned die 17, 15, and 3 are tested in parallel. If a group of diagonally positioned die are placed in functional mode (via each row's independently operated die selectors of FIG. 29) while all other die are in bypass mode, then further test time reduction can be achieved by parallel (i.e. simultaneous) testing of the group of diagonally positioned die via the dedicated row and column bussing paths and probe areas shown in FIG. 30. FIGS. 31A through 31O illustrate the parallel die testing approach as it proceeds across all groups of diagonally positioned die on the wafer. These steps of parallel die testing are listed below, using the die numbering of FIG. 27.

Step 1—Select and Test die 1 (FIG. 31A).
Step 2—Select and Test die 16 and 2 (FIG. 31B).
Step 3—Select and Test die 17, 15, and 3 (FIG. 31C).
Step 4—Select and Test die 32, 18, 14, and 4 (FIG. 3D).
Step 5—Select and Test die 33, 31, 19, 13, and 5 (FIG. 31E).
Step 6—Select and Test die 48, 34, 30, 20, 12, and 6 (FIG. 31F).
Step 7—Select and Test die 49, 47, 35, 29, 21, 11, and 7 (FIG. 31G).
Step 8—Select and Test die 64, 50, 46, 36, 28, 22, 10, and 8 (FIG. 31H).
Step 9—Select and Test die 63, 51, 45, 37, 27, 23, and 9 (FIG. 31I).
Step 10—Select and Test die 62, 52, 44, 38, 26, and 24 (FIG. 31J).

Figure 31K:
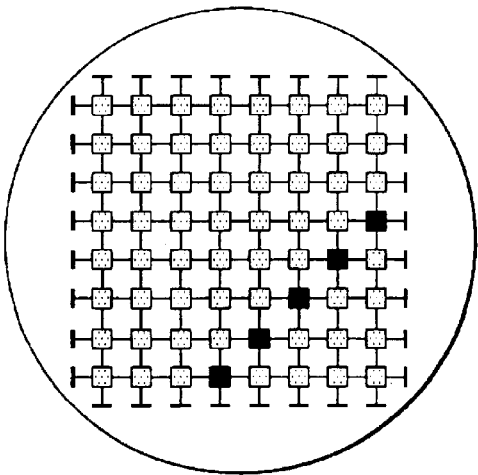

Step 11—Select and Test die 61, 53, 43, 39, and 25 (FIG. 31K).

Figure 31L:
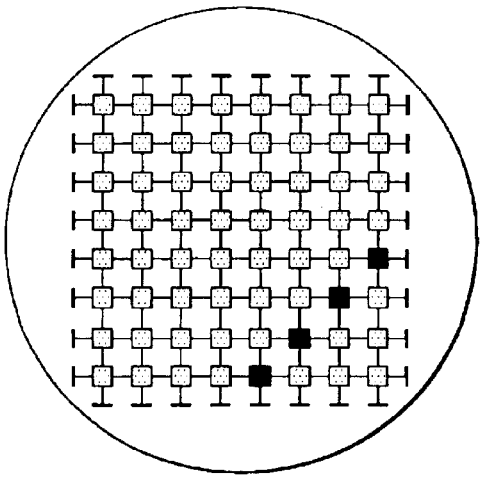

Step 12—Select and Test die 60, 54, 42, and 40 (FIG. 31L).

Figure 31M:
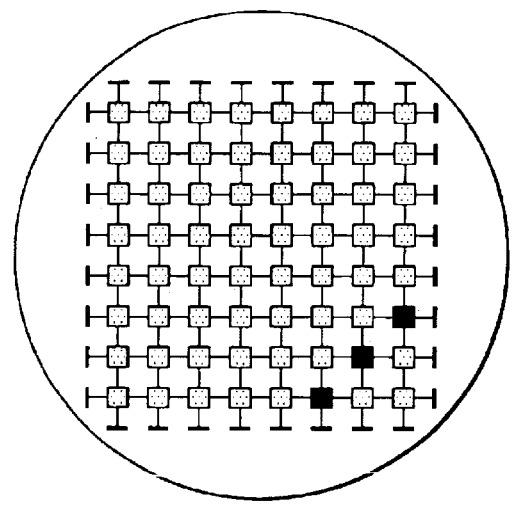

Step 13—Select and Test die 59, 55, and 41 (FIG. 31M).

Figure 31N:
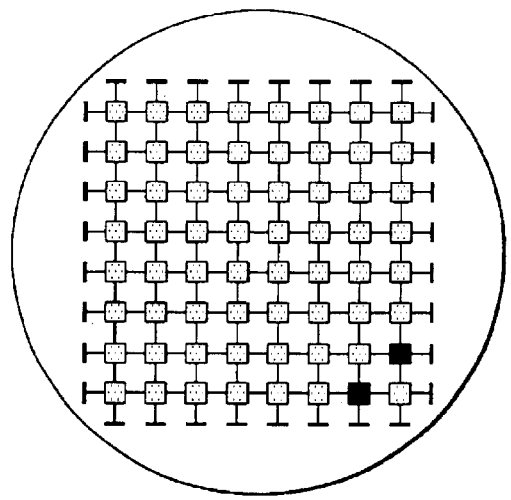
Figure 31O:
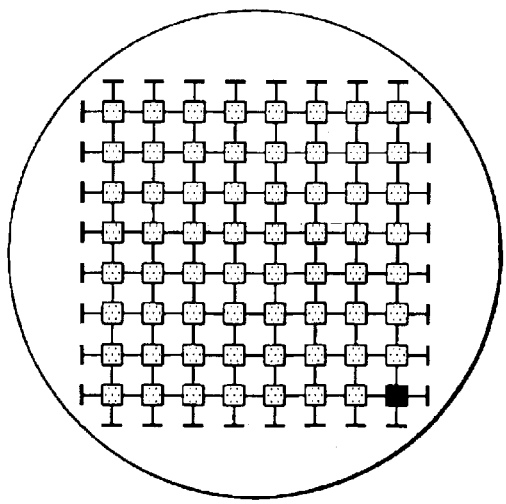

Step 14—Select and Test die 58 and 56 (FIG. 31N).

Step 15—Select and Test die 57 (FIG. 31O).

The foregoing die test sequence notwithstanding, the die can be grouped as desired for parallel testing, so long as each die of the group is row and column accessible independently of all other die of the group. As another example, and using the die numbering of FIG. 27, each of the following eight die groups can be tested in parallel to achieve an eight-step test sequence.

Step 1—Select and Test die 1, 9, 23, 27, 37, 45, 51 and 63.

Step 2—Select and Test die 2, 16, 24, 26, 38, 44, 52 and 62.

Step 3—Select and Test die 3, 15, 17, 25, 39, 43, 53 and 61.

Step 4—Select and Test die 4, 14, 18, 32, 40, 42, 54 and 60.

Step 5—Select and Test die 5, 13, 19, 31, 33, 41, 55 and 59.

Step 6—Select and Test die 6, 12, 20, 30, 34, 48, 56 and 58.

Step 7—Select and Test die 7, 11, 21, 29, 35, 47, 49 and 57.

Step 8—Select and Test die 8, 10, 22, 28, 36, 46, 50 and 64.

The above-described parallel testing of die on wafer can reduce wafer test time as compared to individual, sequential testing of die on wafer.

The present invention is also applicable to IDDQ testing of each die on the wafer. IDDQ testing is the monitoring of current to an IC/die during the application of test patterns. A higher than expected current at a particular test pattern may indicate a defect. The WV and WG bussing arrangement of FIG. 15A is adequate when performing IDDQ testing in the one-die-at-a-time arrangement of FIGS. 25–26, because any unexpected current on WV and/or WG can be attributed to the one die that is in functional mode. As to the parallel die testing arrangement of FIGS. 30–31, row-specific V and G bussing of the type shown in FIG. 28 permits unexpected V and G current to be attributed to the correct die of the diagonal grouping being tested. If this capability is not desired in the test arrangement of FIGS. 30–31, then the WV and WG bussing of the type shown in FIG. 15A can be used in FIGS. 30–31. For example, an additional probe access area could be provided for power supply bussing, in which case PALRn and PARRn need not provide power.

As mentioned above, the present invention permits the tester probe design to be greatly simplified relative to prior art designs, resulting in less expensive testers. Thus, even the IC vendor's customers can afford to maintain their own wafer tester. This permits the vendor to sell complete wafers (rather than singulated die) to customers, who can then repeat the vendor's wafer test and verify the results, and then advantageously singulate the die for themselves. The vendor is thus relieved of the risk of damaging die during singulation, while the customers can advantageously obtain unpackaged die (on wafer), verify that the die have not been damaged in transit from the vendor, and then singulate the die themselves.

Although exemplary embodiments of the present invention are described above, this description does not limit the scope of the invention, which can be practiced in a variety of embodiments.

What is claimed is:

1. A semiconductor wafer, comprising:

an integrated circuit die including functional circuitry for performing normal operating functions of the integrated circuit die, a plurality of bond pads coupled to said functional circuitry, a first said bond pad provided to receive a control signal, and circuitry responsive to said control signal to permit a signal received at a second said bond pad to pass through said integrated circuit die from said second bond pad to a third said bond pad along a test path which connects said second and third bond pads and which is isolated from said functional circuitry; and a further integrated circuit die connected to said third bond pad to receive a test signal via said test path.

2. A method of testing an integrated circuit die on a semiconductor wafer having a plurality of integrated circuit die, comprising the steps of:

connecting first and second bond pads of a first integrated circuit die to provide a test path through the first die; and applying a test signal to a second integrated circuit die connected to the second bond pad of the first die, including the step of passing the test signal from the first bond pad of the first die along the test path through the first die to the second bond pad of the first die.

* * * * *